(12) United States Patent
Shiv

(10) Patent No.: US 11,215,638 B2
(45) Date of Patent: Jan. 4, 2022

(54) PROBE FOR TESTING AN ELECTRICAL PROPERTY OF A TEST SAMPLE

(71) Applicant: CAPRES A/S, Kgs. Lyngby (DK)

(72) Inventor: Lior Shiv, Hillerod (DK)

(73) Assignee: CAPRES A/S, Kgs. Lyngby (DK)

( * ) Notice: Subject to any disclaimer, the term of this patent is extended or adjusted under 35 U.S.C. 154(b) by 48 days.

(21) Appl. No.: 16/487,735

(22) PCT Filed: Mar. 2, 2018

(86) PCT No.: PCT/EP2018/055159
§ 371 (c)(1),
(2) Date: Aug. 21, 2019

(87) PCT Pub. No.: WO2018/162343
PCT Pub. Date: Sep. 13, 2018

(65) Prior Publication Data
US 2020/0241043 A1     Jul. 30, 2020

(30) Foreign Application Priority Data

Mar. 7, 2017  (EP) .................................... 17159606

(51) Int. Cl.
*G01R 1/067* (2006.01)
*G01R 1/073* (2006.01)
*G01R 31/28* (2006.01)

(52) U.S. Cl.
CPC ..... *G01R 1/06738* (2013.01); *G01R 1/07307* (2013.01); *G01R 31/2889* (2013.01)

(58) Field of Classification Search
CPC ............ G01R 1/06738; G01R 1/07307; G01R 31/2889; G01R 31/2648; G01R 31/2831; G01R 31/2884
See application file for complete search history.

(56) References Cited

U.S. PATENT DOCUMENTS 5,386,720 A  *  2/1995  Toda ..................... B82Y 35/00
                                               73/105
6,196,061 B1     3/2001  Adderton et al.
(Continued)

FOREIGN PATENT DOCUMENTS

CN      101443913 A      5/2009
CN      103852702 A      6/2014
(Continued)

OTHER PUBLICATIONS

Keller et al., "Microscopic four-point probe based on SU-8 cantilevers". Rev. Scientific Instruments, 76(12), p. 125102, 2005.
(Continued)

*Primary Examiner* — Dominic E Hawkins
(74) *Attorney, Agent, or Firm* — Hodgson Russ LLP

(57) ABSTRACT

A probe for direct nano- and micro-scale electrical characterization of materials and semi conductor wafers. The probe (10) comprises a probe body (12), a first cantilever (20a) extending from the probe body. The first cantilever defining a first loop with respect to said probe body. The probe further comprises a first contact probe being supported by said first cantilever, and a second contact probe being electrically insulated from the first contact probe. The second contact probe being supported by the first cantilever or by a second cantilever (20b) extending from the probe body.

14 Claims, 17 Drawing Sheets

(56) References Cited

U.S. PATENT DOCUMENTS

| | | | |
|---|---|---|---|
| 7,337,656 B2* | 3/2008 | Shirakawabe | G01N 23/00 73/105 |
| 2002/0142509 A1 | 10/2002 | Hattori et al. | |
| 2004/0217350 A1 | 11/2004 | Sugiura et al. | |
| 2011/0126329 A1 | 5/2011 | Despont et al. | |
| 2011/0285416 A1* | 11/2011 | Petersen | G01R 1/07307 324/755.01 |
| 2012/0119770 A1* | 5/2012 | Baekbo | G01R 1/06733 324/750.22 |
| 2015/0192617 A1* | 7/2015 | Liu | G01R 1/067 324/755.01 |

FOREIGN PATENT DOCUMENTS

| | | |
|---|---|---|
| CN | 203720216 U | 7/2014 |
| EP | 1182460 | 2/2002 |
| EP | 1182460 A2 | 2/2002 |
| EP | 1197726 | 4/2002 |
| EP | 1197726 A1 | 4/2002 |
| EP | 1939640 | 7/2008 |
| EP | 1939640 A2 | 7/2008 |
| EP | 2141503 | 1/2010 |
| EP | 2141503 A1 | 1/2010 |
| EP | 2293086 | 3/2011 |
| EP | 2293086 A1 | 3/2011 |
| JP | H11326350 A | 11/1999 |
| WO | 0003252 A3 | 4/2000 |
| WO | 2007066643 A1 | 6/2007 |
| WO | WO2007066643 | 6/2007 |
| WO | 2013190025 A1 | 12/2013 |
| WO | WO2013190025 | 12/2013 |

OTHER PUBLICATIONS

Katoaka et al., "Electroplating Ni micro-cantilevers for low contact-force IC probing". Sensors and Actuators A, 103, 116-121, 2003.
WIPO, ISR for PCT/EP2018/055159, Sep 26, 2018.
International Search Report on corresponding PCT application (PCT/EP2018/055159) from International Searching Authority (EPO) dated Sep. 26, 2018.
Written Opinion on corresponding PCT application (PCT/EP2018/055159) from International Searching Authority (EPO) dated Sep. 26, 2018.
Katoaka et al.; "Electroplating Ni micro-cantilevers for low contact-force IC probing"; Sensors and Actuators A: Phys. Elsevier BV, NL, vol. 103, No. 1-2; Jan. 15, 2003; pp. 116-121.
Keller et al.; "Microscopic four-point probe based on SU-8 cantilevers"; Review of Scientific Instruments; American Institute of Physics, vol. 74, No. 12; Melville, NY, US; Dec. 14, 2005; pp. 125102-125102-4.
Li et al., "Research progress of microcosmic four-point probe measurement of semiconductor surface electrical properties", Vacuum, Jan. 31, 2011, pp. 1-8, vol. 48, Issue 1.
Su et al., "Analysis of influence of probe wandering on measurement of thin layer resistance of silicon wafer by square four-probe tester", Journal of North China Institute of Aerospace Industry, Oct. 31, 2007, pp. 35-37, vol. 17, Issue 5, China.
CNIPA, Office Action for CN Application No. 201880016603.7, dated Feb. 3, 2021.

* cited by examiner

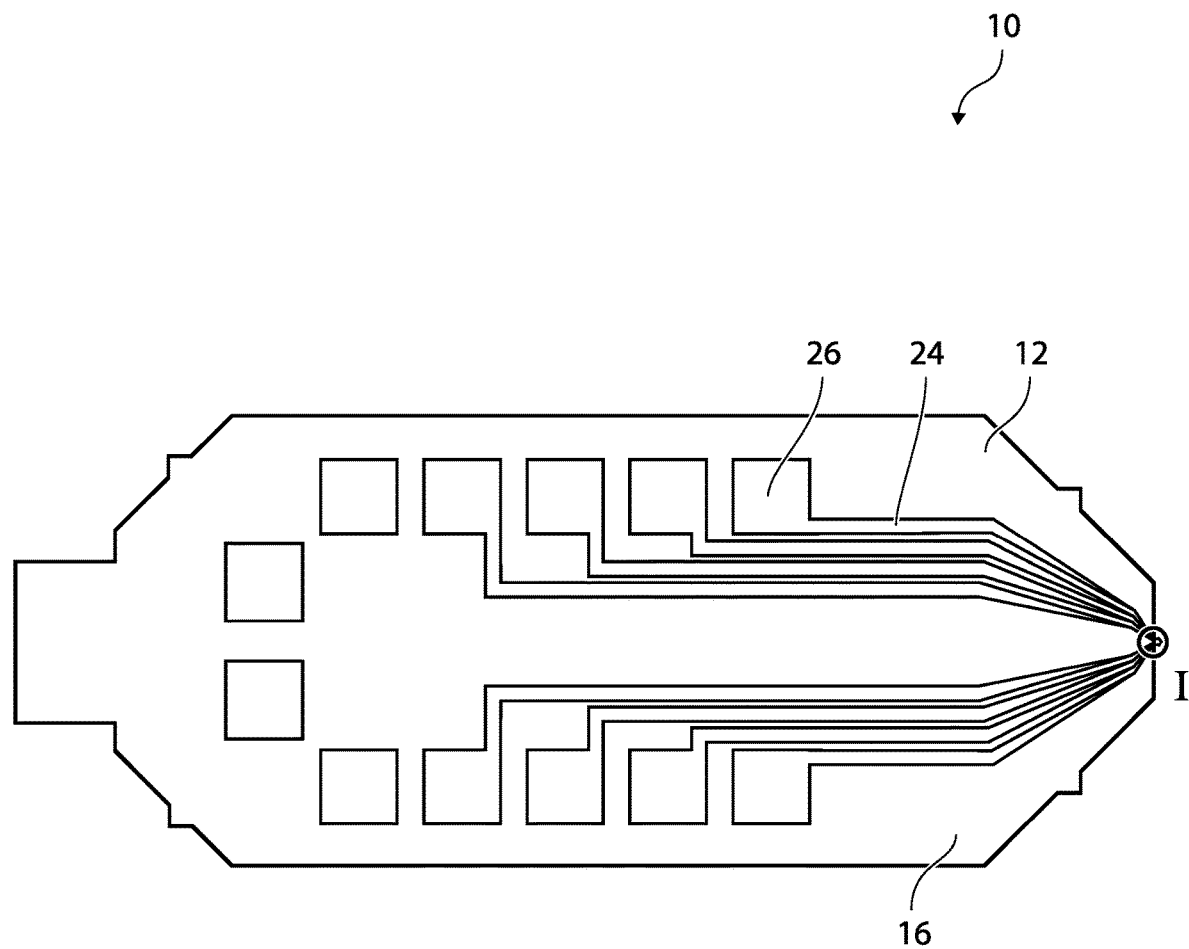
FIG. 1a
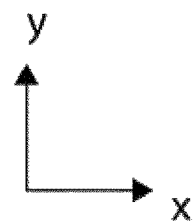

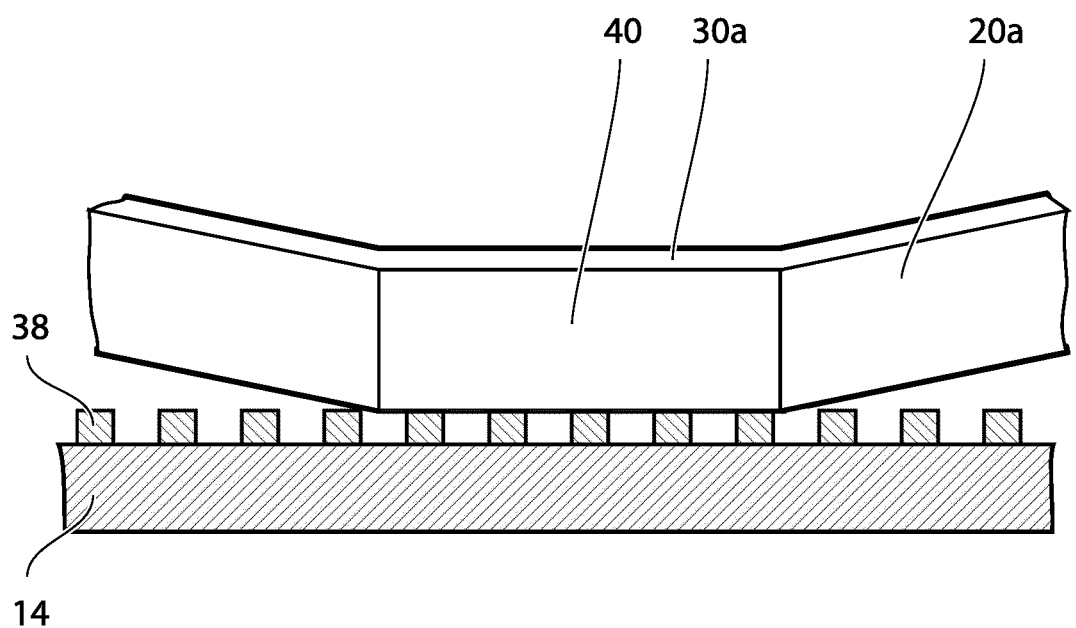
FIG. 2c
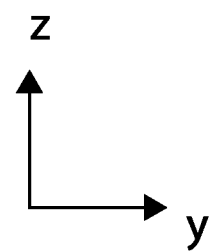

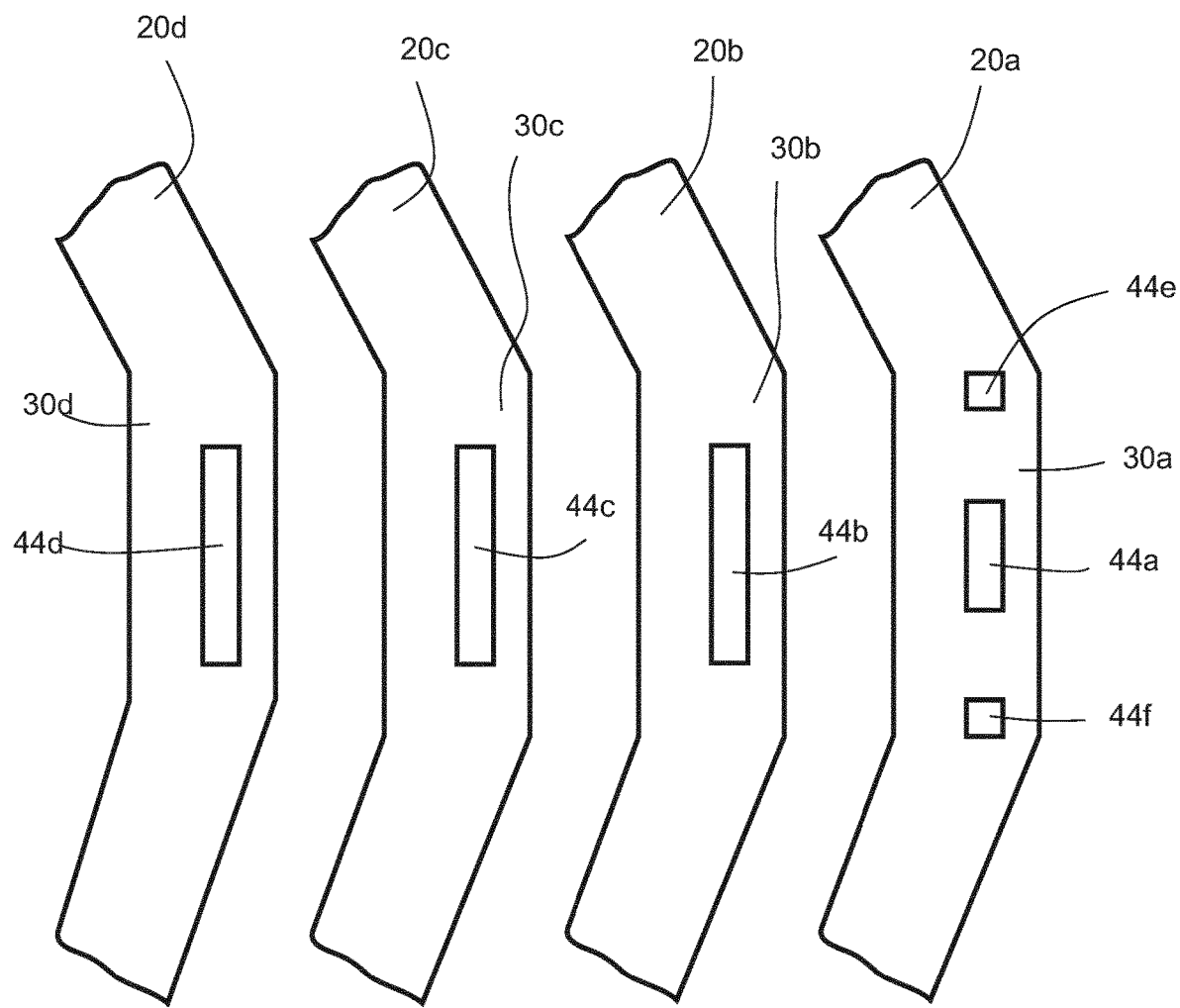
FIG. 6a
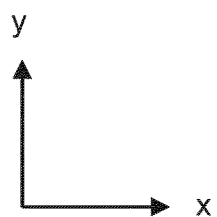

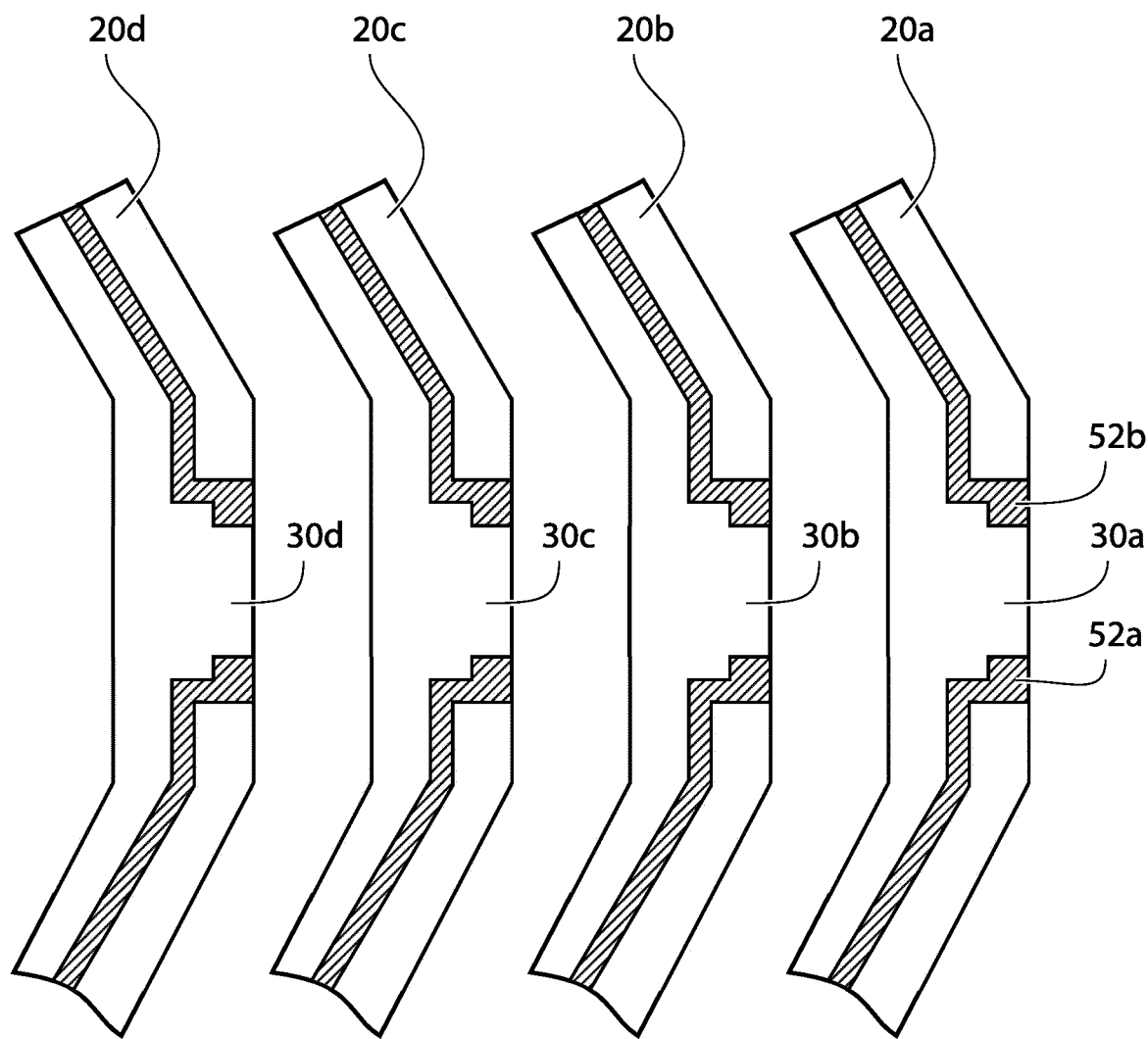
FIG. 7a
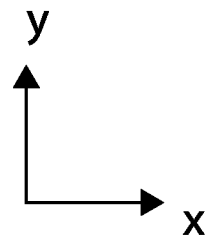

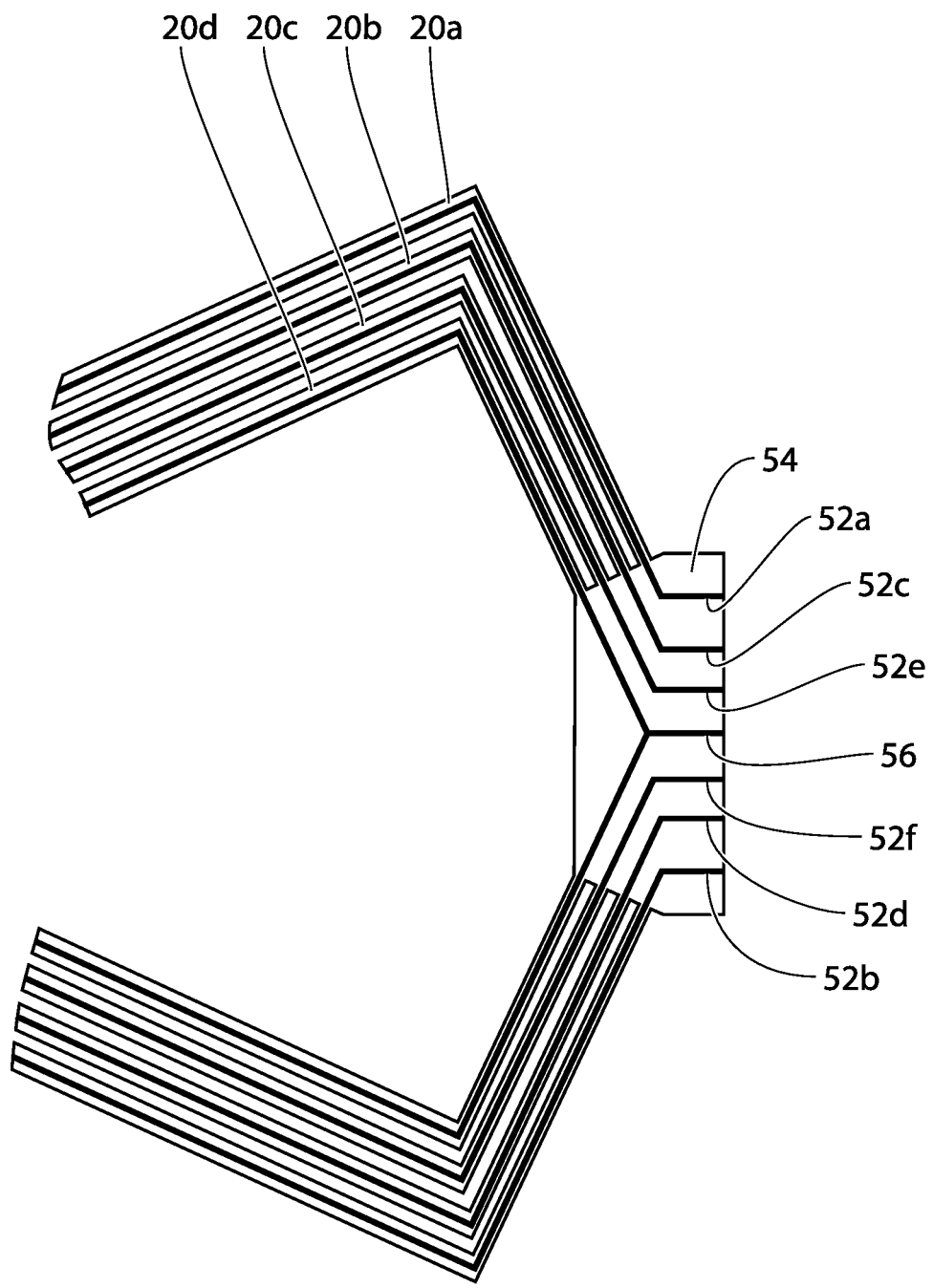
FIG. 8b
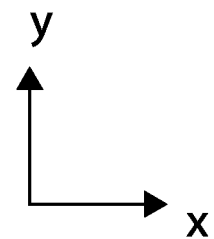

PROBE FOR TESTING AN ELECTRICAL PROPERTY OF A TEST SAMPLE

CROSS-REFERENCE TO RELATED APPLICATIONS

This application is the national phase entry, under 35 U.S.C. Section 371(c), of International Application No. PCT/EP2018/055159, filed Mar. 2, 2018, claiming priority from European Patent Application No. 17159606.7, filed Mar. 7, 2017. The disclosures of the International Application and the European Application from which this application claims priority are incorporated herein by reference in their entirety.

FEDERALLY SPONSORED RESEARCH OR DEVELOPMENT

Not Applicable

DESCRIPTION

The present invention relates to a probe for testing an electrical property of a test sample, specifically, the present invention is directed to a micro cantilever four point probe. The present invention furthermore relates to a method of testing an electrical property of a test sample, and a method of initializing a routine for testing an electrical property of a test sample.

The test sample may be a semiconductor wafer of silicon having an integrated circuit implemented with a number of CMOS finFET transistors (nonplanar, double-gate transistor built on a Silicon-On-Insulator or Si substrate).

Such a test sample may contain test pads consisting of arrays of fins. The fin material may be Si, SiGe or any other semiconductor. A typical array of fins consists of a large number of fins in parallel, with a certain length and a certain pitch in between. A typical length is 50 µm and above and a typical pitch is between 50 nm and 500 nm.

A typical fin dimension comprises a width between 20 and 500 nm, and a height between 30 and 200 nm. The fins are typically electrically insulated from each other but several fins may be merged together to a single conducting line.

The electrical property of the test sample to be measured may be an electrical resistance of a part of the test sample, for example the electrical resistance of a single fin measured in Ohm's per µm length.

A test sample may also consist of a semiconductor wafer with a thin planar conducting film or a thin multilayer stack forming, for example a magnetic tunnelling junction (MTJ).

A four point probe measurement and test routine is also known as four terminal sensing, wherein an electrical impedance measuring technique uses separate pairs of current-carrying and voltage-sensing electrodes.

When performing resistance measurements for determining electrical properties of a test sample, a test probe comprising one or more arms each carrying a tip for establishing electrical contact to the test surface is brought into contact with the test surface.

An example of a micro four point probe is disclosed in EP2293086, which disclosure is incorporated in the present application by reference. The probe disclosed in EP2293086 comprises four cantilevers extending from a probe body. Each cantilever has an L-shape geometry. The L shape form provides flexibility in all lateral dimensions and as such certain tolerance against vibrations and drifts. On the other hand, forces are applied to the surface in an arbitrary lateral direction.

An example of a twelve point probe is disclosed in EP2864800, which also discloses a fabrication process for manufacturing a micro point probe in a semiconductor material, i.e. with etching and depositing different layers on a substrate. EP2864800 and the fabrication process is incorporated in the present disclosure by reference.

It is one of the objects of the present invention to provide a probe having cantilevers, with a well-controlled contact force in the lateral direction so that a potential damage to the fins can be minimized, i.e. such that the fins do not break or bend. It is a further object of the present invention to ensure a low ohmic contact between the probe and the fin.

The above object and advantages together with numerous other objects and advantages, which will be evident from the description of the present invention, are according to a first aspect of the present invention obtained by:

A probe for testing an electrical property of a test sample, the probe comprising:
  a probe body having a first side defining a substantially planar body surface,
  a first cantilever extending from the probe body, and having a proximal end at the probe body and a distal end, the distal end being opposite to the proximal end,
  the first cantilever defining a first loop with respect to the probe body, the first loop extending in a first plane substantially parallel to the planar body surface,
  a first contact probe being supported by the first cantilever,
  a second contact probe being electrically insulated from the first contact probe,
  the second contact probe being supported by the first cantilever or by a second cantilever extending from the probe body towards the distal end,
  the second cantilever defining a second loop with respect to the probe body, the second loop extending in a second plane substantially parallel to the first plane, and
  the second loop being within a projection of the first loop onto the second plane.

Comprising is to be understood in the broader meaning in such a way that the above-mentioned probe comprising a first cantilever and a second cantilever does not exclude additional cantilevers, i.e. a third cantilever and a fourth cantilever etc. are encompassed by the wording.

The probe may be fabricated in a clean room using photolithography or electron beam lithography in order to pattern parts of a layer of the probe or probe substrate. Light may be used to transfer a pattern from a photomask to a light-sensitive chemical photoresist on the layer/substrate. A series of chemical treatments may either engrave the exposure pattern into the layer/substrate, or enable deposition of a new material in the desired pattern.

A substantially planar surface means a height difference of less than 20% between a highest point and a lowest point. Substantially parallel means directions deviating with less than 10°. Substantially orthogonal means 90°±10°.

A first axis is defined as the axis extending through the proximal end and the distal end. The distal end may also be a distal end of the probe.

The first plane may coincide with the second plane thereby having the first loop and the second loop in the same plane.

A loop with respect to the probe body means that the loop starts and ends at the probe body, i.e. the loop starts at a first point on the probe body, extends from the probe body and returns to the probe body at a second point on the probe body. Thus, the loop may form a U-shape or C-shape when seen separate from the probe body.

The circumference of the second loop is less than the circumference of the first loop, i.e. the second loop is within the first loop when they are in the same plane.

A cantilever is a structural element anchored at least at one end to a support from which it is protruding. The cantilever is elastic, and the cantilever deflection δ (deviation of the distal end from the plane, which the cantilever is in under no stress) can be approximated from the relation F=k·δ, where k is the spring constant of the cantilever and F is the force applied at the distal end—at least for small deflections.

Each cantilever may have a geometry defining a closed polygon, i.e. each cantilever may be made of a number of straight or curved sections being put together in the U-shape.

The first loop as well as any of the other loops may be symmetric with respect to the first axis.

Each cantilever may comprise a first section at the distal end, wherein the first section extends substantially orthogonal to the first axis and constitutes a first lateral section. The first lateral section may form a substantially straight or curved line.

The lateral section of each cantilever is the section, which is used to contact the test sample. To minimize uncertainty in the measurement, the contact area(s) of the probe may be made smaller by having protrusions on the side of each cantilever that faces and abuts the test sample, i.e. each protrusion extends from a lateral section in a direction substantially orthogonal to the first plane.

Any of the protrusions may have a cross section with a normal in the length of a lateral section, which defines a trapezoid or rectangular geometry.

Each lateral section may have a number of protrusions separated from each other.

Each of the first and the second contact probes is made of an electrically conducting material, which may be a metal film deposited on a cantilever surface facing the test sample when a test is performed.

The first contact probe constitutes a first electrode in a pair of electrodes, where the second contact probe constitutes the second electrode in the pair of electrodes. The pair of electrodes are the connections from the probe to the test sample, which is to be acted or measured upon electrically.

Each of the first and the second contact probes has a terminal defining the point at which a connection to the test sample is provided.

Each contact probe (metal film) may be connected to respective electrical lines on the probe body. The electrical lines connect the contact probes with contact pads.

The probe may comprise a number of contact pads/terminals, including a first contact pad on the first side. Each contact probe is connected to a respective contact pad via an electrical line or trace on the probe body. The probe is to be inserted in a holding device (test apparatus), which has terminals for contacting any number of the contact pads. The test apparatus can generate electric signals that may be transmitted to the test sample via the probe, and the test apparatus may also have measuring units for determining impedance values.

The first contact probe on the first cantilever may be connected to a first contact pad, and the second contact probe on the first cantilever may be connected to a second contact pad. Furthermore, the first and second contact probes on the first cantilever may be connected to each other at the distal end thereby forming an electric circuit or connection between the first contact pad and the second contact pad. The first and second contact pad may then be put in contact with the terminals of a current generator of the test apparatus for sending a current through the circuit. Hereby a magnetic field can be generated, which is substantially orthogonal to the first plane at the field's intersection with the first plane.

The probe may be made from silicon, poly-silicon or another semiconductor material or from dielectric material like $SiO_2$, where the structure of the probe may be formed by depositing and etching routines.

The probe may comprise a third cantilever extending from the probe body towards the distal end. The third cantilever can define a third loop with respect to the probe body, the third loop extending in a third plane substantially parallel to the second plane. The third loop may be within a projection of the second loop onto the third plane.

The probe may comprise a fourth cantilever extending from the probe body towards the distal end. The fourth cantilever can define a fourth loop with respect to the probe body, the fourth loop extending in a fourth plane substantially parallel to the third plane. The fourth loop may be within a projection of the third loop onto the fourth plane.

The cantilevers may be connected to each other at the distal ends so as to form a mono-cantilever.

According to a second aspect of the present invention, the above objects and advantages are obtained by:

A probe for testing an electrical property of a test sample, the probe comprising:

a probe body having a first side defining a substantially planar body surface, the first probe body being manufactured from a semiconductor wafer, a first arm extending from the probe body, and having a proximal end at the probe body and a distal end, the distal end being opposite to the proximal end, the first arm defining a first loop with respect to the probe body, the first loop extending in a first plane substantially parallel to the planar body surface, the first arm comprising a metal film deposited on and extending on a first surface of the first arm, a first cantilever extending from the probe body towards the distal end, the first cantilever extending in a second plane substantially parallel to the first plane, the first cantilever being within a projection of the first loop onto the second plane, a first contact pad on the first side, a second contact pad on the first side, the first contact pad being connected to the second contact pad via a first electrical line on the probe body and the metal film and a second electrical line on the probe body thereby forming a path for an electrical current for producing a first magnetic field substantially orthogonal to the second plane at the second plane.

The first arm may be a rigid structure, which is less elastic than the cantilever.

The probe is to be inserted into a test apparatus, which holds and guides the probe in contact with the test sample. The first and second contact pads may be put in contact with the terminals of a current generator of the test apparatus. The test apparatus may then send a current through the circuit formed by the first and second electrical lines and the metal film.

The first magnetic field can be used for a fast switching of a MTJ by short pulses of high currents. The current may be between 0.5 A and 3 A, and the pulse frequency may be in the micro second range. Thus, the measurement time may be reduced.

For example, a magnetic field greater than 50 mT is required up to 10 μm away from the current loop in order to switch a MTJ. This field can be generated by a current pulse of 2.5 A. A current pulse as short as 1 μsec should be sufficient to switch the MTJ and it should be therefore possible to switch the MTJ at a fast rate and by that reduce the measurement time.

The probe may be part of an assembly, which includes a magnet. The magnet produces a second magnetic field larger than the first magnetic field required for switching the junction. The second magnetic field may be used to correct for offsets in the first magnetic field. The offset may be greater than 100 mT. Thus, the magnet may provide the offset and the current loop may be used to provide the smaller magnetic field needed for switching the MTJ.

According to a third aspect of the present invention, the above objects and advantages are obtained by:

A method of testing an electrical property of a test sample, the method comprising:
providing a multi point probe,
the probe comprising:
a probe body having a first side defining a substantially planar body surface,
a first cantilever extending from the probe body, and having a proximal end at the probe body and a distal end, the distal end being opposite to the proximal end, the first cantilever defining a first loop with respect to the probe body, the first loop extending in a first plane substantially parallel to the planar body surface,
a first contact probe being supported by the first cantilever,
a second contact probe being electrically insulated from the first contact probe, the second contact probe being supported by the first cantilever or a second cantilever extending from the probe body towards the distal end,
the second cantilever defining a second loop with respect to the probe body, the second loop extending in a second plane substantially parallel to the first plane,
and the second loop being being within a projection of the first loop onto the second plane, the method further comprising:
contacting the first contact probe with the test sample at a first contact point,
contacting the second contact probe with the test sample at a second contact point, and
performing a multi point measuring routine.

The multi point probe may be a micro four point probe, and the multi point measuring routine may comprise measuring a voltage between the first contact probe and the second contact probe, i.e. between the point where the first and second contact probes are in contact with the test sample.

The multi point probe may comprise a third contact probe and a fourth contact probe, and an electric current may be injected in the test sample via the third contact probe and the fourth contact probe, i.e. the third and fourth contact probes constitute a pair of electrodes. The first and second contact points may be between the third and fourth contact points.

An electrical impedance or resistance value of the test sample may be determined as a function of the voltage and the current. Material properties of the test sample may also be used in determining the resistance. The resistance may be a sheet resistance.

According to a fourth aspect of the present invention, the above objects and advantages are obtained by:

A method of initializing a routine for testing an electrical property of a semiconductor wafer having a native oxide surface layer, the method comprising
providing a multi point probe,
the probe comprising:
a probe body,
a first cantilever extending from the probe body,
a first contact probe being supported by the first cantilever,
a second contact probe being electrically insulated from the first contact probe,
the second contact probe being supported by the first cantilever or a second cantilever extending from the probe body,
the method further comprising:
contacting the first contact probe with the semiconductor wafer at a first contact point,
contacting the second contact probe with the silicon wafer at a second contact point, and
applying a first voltage between the first contact point and the second contact point so as to cause an electric breakdown of the native oxide surface layer of the semiconductor wafer.

The first voltage may be established by applying an alternating current between the first contact point and the second contact point having an amplitude value between 10 μA and 200 μA. The frequency of the alternating current may be between 1 kHz and 2 kHz. The first voltage may be greater than 0 V and less than 10 V. The first contact probe and the second contact probe may constitute a pair of electrodes used for injecting the alternating current in the test sample between the first contact point and the second contact point.

The probe may comprise a third contact probe and a fourth contact probe. The third contact probe may be placed in contact with the semiconductor wafer at a third contact point, and the fourth contact probe may be placed in contact with the semiconductor wafer at a fourth contact point.

A second voltage may be established between the first contact point and the third contact point by injecting a current in the test sample via the first contact probe and the third contact probe. The current may be defined with the same values as mentioned above.

Similarly, a third voltage may be established between the first contact point and the fourth contact point by injecting a current in the test sample via the first contact probe and the fourth contact probe.

A fourth voltage may be established between the first second point and the fourth contact point by injecting a current in the test sample via the second contact probe and the fourth contact probe.

According to a fifth aspect of the present invention, the above objects and advantages are obtained by:

A method of initializing a routine for testing an electrical property of a semiconductor wafer, the method comprising
providing a multi point probe,
the probe comprising:
a probe body,
a first cantilever extending from the probe body,
a first contact probe being supported by the first cantilever,
a second contact probe being electrically insulated from the first contact probe, the second contact probe being supported by the first cantilever or a second cantilever extending from the probe body, the first contact probe and/or the second contact probe comprising an oxide surface layer, the method further comprising:

contacting the first contact probe with the semiconductor wafer at a first contact point, contacting the second contact probe with the semiconductor wafer at a second contact point, and establishing a first voltage between the first contact point and the second contact point so as to cause an electric breakdown of the native oxide surface layer of the first contact probe and/or the second contact probe.

The first contact probe as well as the second contact probe may be made of a non noble metal, i.e. a base metal such as one of the transition metals, which are prone to oxide and thereby have an oxide surface layer with a lower conductivity than the metal.

According to a sixth aspect of the present invention the above objects and advantages are obtained by:

A method of testing an electrical property of a semiconductor wafer, the method comprising:

providing a multi point probe, the probe comprising:

a probe body having a first side defining a substantially planar body surface, a first cantilever extending from the probe body, and having a proximal end at the probe body and a distal end, the distal end being opposite to the proximal end, the first cantilever defining a first loop with respect to the probe body, a first contact probe being supported by the first cantilever, a second contact probe being electrically insulated from the first contact probe, the second contact probe being supported by the first cantilever or a second cantilever extending from the probe body towards the distal end, and the semiconductor wafer comprising a first fin extending in a first plane in a first direction, the method further comprising:

contacting the first contact probe with the first fin at a first contact point, contacting the second contact probe with the first fin at a second contact point, providing a magnet and orientating the magnet such that a magnetic field produced by the magnet is orthogonal to the first direction in the first plane, and performing a multi point measuring routine.

The magnetic field can change the flow of charged carriers in the fins during measurement which can be detected via the change in the measured fin resistance. The technique can be used to evaluate the mobility and concentration of free charge carriers in the fins.

The probe provided in the method according to the sixth aspect of the present invention may additionally comprise any of the probe features mentioned in connection with the probe according to the first aspect of the present invention.

The invention will now be explained in more detail below by means of examples of embodiments with reference to the very schematic drawing, in which FIG. 1a shows a perspective of a probe.

FIG. 1b shows an enlarged view of the section I in FIG. 1a.

FIG. 2b shows the cross section A-A' in FIG. 2a.

FIG. 2c shows the cross section B-B' in FIG. 2a.

FIG. 6a shows a perspective of a distal end of a probe.

FIG. 7a shows a perspective of a distal end of a probe.

FIG. 8b shows a perspective of probe comprising a mono-cantilever.

Figure 1B:
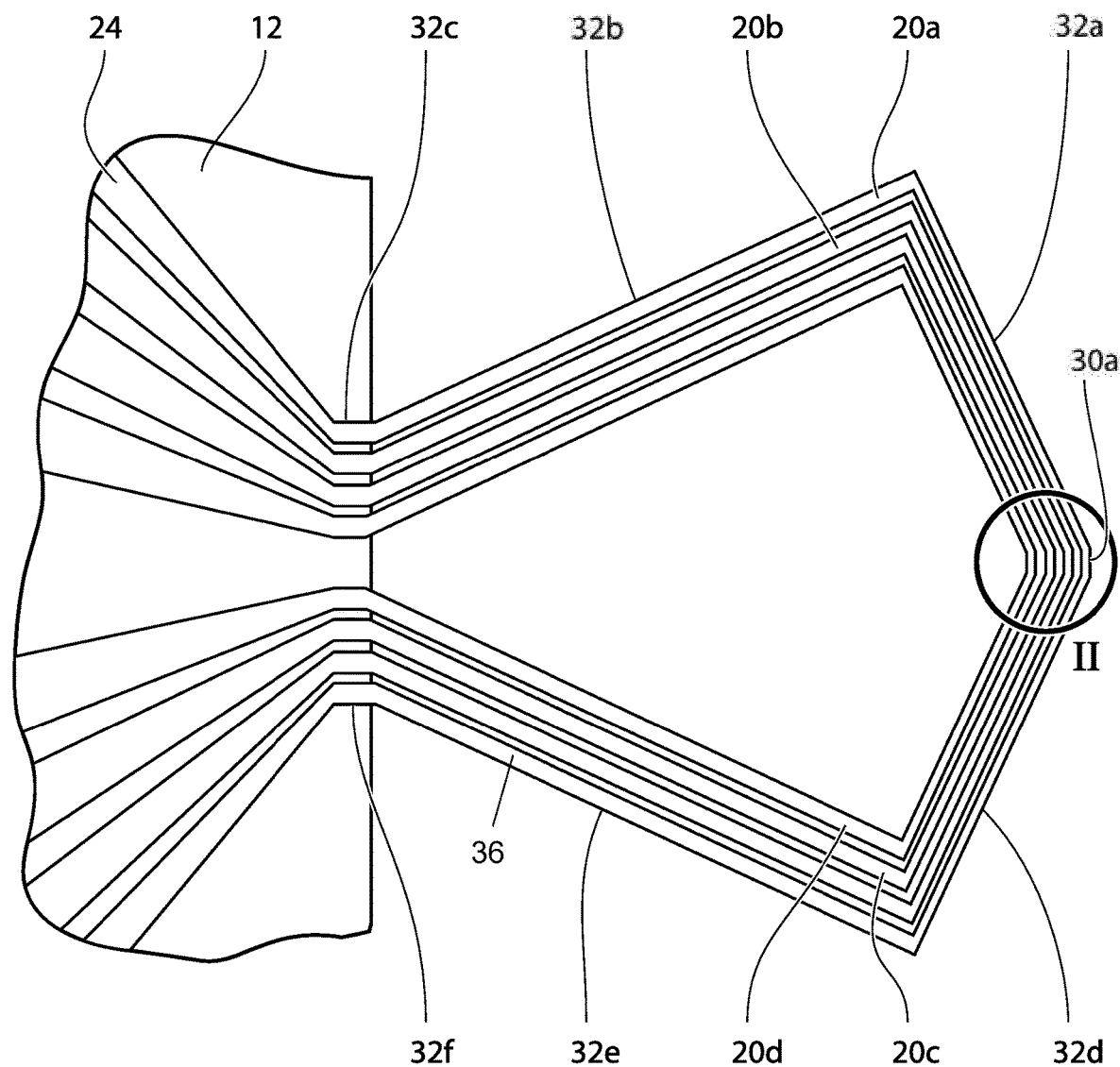

The present invention wilt now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. Like elements will thus not be described in detail with respect to the description of each figure.

FIG. 1a shows a perspective of a probe for testing an electrical property of a test sample.

The probe comprises a probe body 12 having a first side 16, and second side 18. The first side defines a substantially planar body surface. The probe body is made of a number of semiconductor and/or dielectric layers.

FIG. 1b shows an enlarged view of section I in FIG. 1a.

The probe comprises a number of cantilevers, which are also made of a semiconductor material such as silicon. In FIG. 1a, a first, second, third and fourth cantilevers 20a-d are illustrated. Each cantilever extends a certain distance from the probe body. In FIG. 1a, the cantilevers extend from the probe body with different distances—the first cantilever 20a extending the furthest. Each cantilever has a distal end that is furthest from the probe body. A distal end of the probe is defined as being equivalent to where the first cantilever extends the furthest from the probe body.

A proximal end of a cantilever is defined as being opposite the distal end, i.e. furthest from the distal end. Thus, the proximal end being closer to the probe body than the distal end. Each cantilever is supported by the probe body at the proximal end.

The distance between the proximal end and the distal end is typically in the range of 50 to 200 μm.

A first axis is defined as the axis, which goes through the proximal end and the distal end. The first axis extends in the x-direction of the reference coordinate system in FIG. 1a. A second axis is defined as being orthogonal to the first axis. The second axis extends in a lateral direction, i.e. in the y-direction of the reference coordinate system in FIG. 1a.

Each cantilever may support a number of contact probes for contacting a respective part of the test sample and establishing an electrical connection to that part.

A contact probe is constituted by an electrically conducting metal film deposited on a cantilever surface 36 facing the test sample 14 when a test is performed.

Each contact probe (metal film) is connected to respective electrical lines on the probe body. The electrical lines connect the contact probes with contact pads, i.e. the metal film on the first cantilever 20a is electrically connected to a first electrical line 24, which leads to a first contact pad 26. The contact pads are for establishing electrical connections between the probe and a test apparatus holding the probe.

The first cantilever 20a forms a first loop with respect to the probe body, i.e. the first loop begins and ends on the probe body—at a first point of the probe body and at a second point of the probe body respectively. The first loop extends in a first plane substantially parallel to the planar body surface, and is illustrated as having mirror symmetry with respect to the first axis.

In FIG. 1b, the first cantilever 20a is made of a first set of seven sections, which are serially connected to each other. The first loop has a first circumference constituted by the combined lengths of the seven sections. The first cantilever may be made with another number of sections.

A first section at the distal end of the first cantilever extends substantially orthogonal to the first axis and constitutes a first lateral section 30a. The first lateral section extends in the y-direction of the reference coordinate system, i.e. the first lateral section extends in the lateral direction. The first lateral section can be made with a length in the lateral direction between 1 to 30 µm.

A second section 32a and a third section 32b are connected to each other and form a first L-shaped section. The first L-shaped section connects a first end of the first lateral section with a fourth section 32c, which is supported on the probe body. A second L-shaped section, constituted by a fifth section 32d and sixth section 32e, is found across from the first L-shaped section connecting a second end of the first lateral section with a fifth section 32f, which is also supported on the probe body.

A second cantilever 20b extends from the probe body in a second plane, which is substantially parallel with the first plane. Preferably, the probe is made such that the first and second cantilevers extend in the same plane when no stress are applied to them.

The second cantilever forms a second loop with respect to the probe body, i.e. the second loop begins and ends on the probe body—at a third point of the probe body and at a fourth point of the probe body respectively. The second loop is also illustrated as having mirror symmetry with respect to the first axis.

In FIG. 1b, the second cantilever is made of a second set of seven sections, which are serially connected to each other. The second loop has a first circumference constituted by the combined lengths of the seven sections. The second cantilever may be made with another number of sections.

The second loop is within the first loop, i.e. the second loop has a geometry corresponding to the geometry of the first loop, but being scaled down so that the second loop extends within the first loop—the second loop being smaller than the first loop.

A third cantilever 20c extends from the probe body in a third plane, which is substantially parallel with the second plane. Preferably the probe is made such that the first, second and third cantilevers extend in the same plane when no stress is applied to them.

The third cantilever forms a third loop with respect to the probe body, i.e. the third loop begins and ends on the probe body—at a fifth point of the probe body and at a sixth point of the probe body respectively. The third loop is also illustrated as having mirror symmetry with respect to the first axis.

In FIG. 1b, the third cantilever is made of a third set of seven sections, which are serially connected to each other. The third loop has a first circumference constituted by the combined lengths of the seven sections. The third cantilever may be made with another number of sections.

The third loop is within the second loop, i.e. the third loop has a geometry corresponding to the geometry of the second loop, but being scaled down so that the third loop extends within the second loop—the third loop being smaller than the second loop.

A fourth cantilever 20d extends from the probe body in a fourth plane, which is substantially parallel with the third plane. Preferably, the probe is made such that the first, second, third and fourth cantilevers extend in the same plane when no stress is applied to them.

The fourth cantilever forms a fourth loop with respect to the probe body, i.e. the fourth loop begins and ends on the probe body—at a seventh point of the probe body and at an eight point of the probe body respectively. The fourth loop is also illustrated as having mirror symmetry with respect to the first axis.

In FIG. 1b, the fourth cantilever is made of a second set of seven sections, which are serially connected to each other. The fourth loop has a first circumference constituted by the combined lengths of the seven sections. The fourth cantilever may be made with another number of sections.

The fourth loop is within the third loop, i.e. the fourth loop has a geometry corresponding to the geometry of the third loop, but being scaled down so that the fourth loop extends within the third loop—the fourth loop being smaller than the third loop.

Each of the sections in the four sets of sections is constituted by a straight line with a rectangular or trapezoid cross section, and having a length and an angle with respect to neighbouring sections.

The probe is fabricated from silicon-on-insulator wafers with a typical buried oxide thickness of 500 to 1000 nm, and a typical top silicon layer of 5 to 10 µm.

Typical dimensions for the third section 32b are 120 to 160 µm long, 1 to 3 µm wide, 15 to 30 degrees to the X axis.

Typical dimensions for the second section 32a are 40 to 80 µm long, 1 to 2 µm wide, −65 to −85 degrees to the X axis.

The first lateral section is 1 to 30 µm long in the Y direction.

Fabricated in 10 µm thick silicon the first cantilever will have the following mechanical properties. Spring constant in the Z direction: 12 N/m. Contact force in Z direction at 8 µm engage: 100 µN.

The flexibility in the X and Y directions insures stable contact with no sliding up to approximately 800 nm vibrations amplitude (~10% of the engage depth).

The shape of the other cantilevers is deduced from here to give the same engage force and flexibility in X and Y at the same final engage point. Typically the other loops will have the same dimensions for the second section and shorter/wider dimensions for the third section.

Figure 1C:
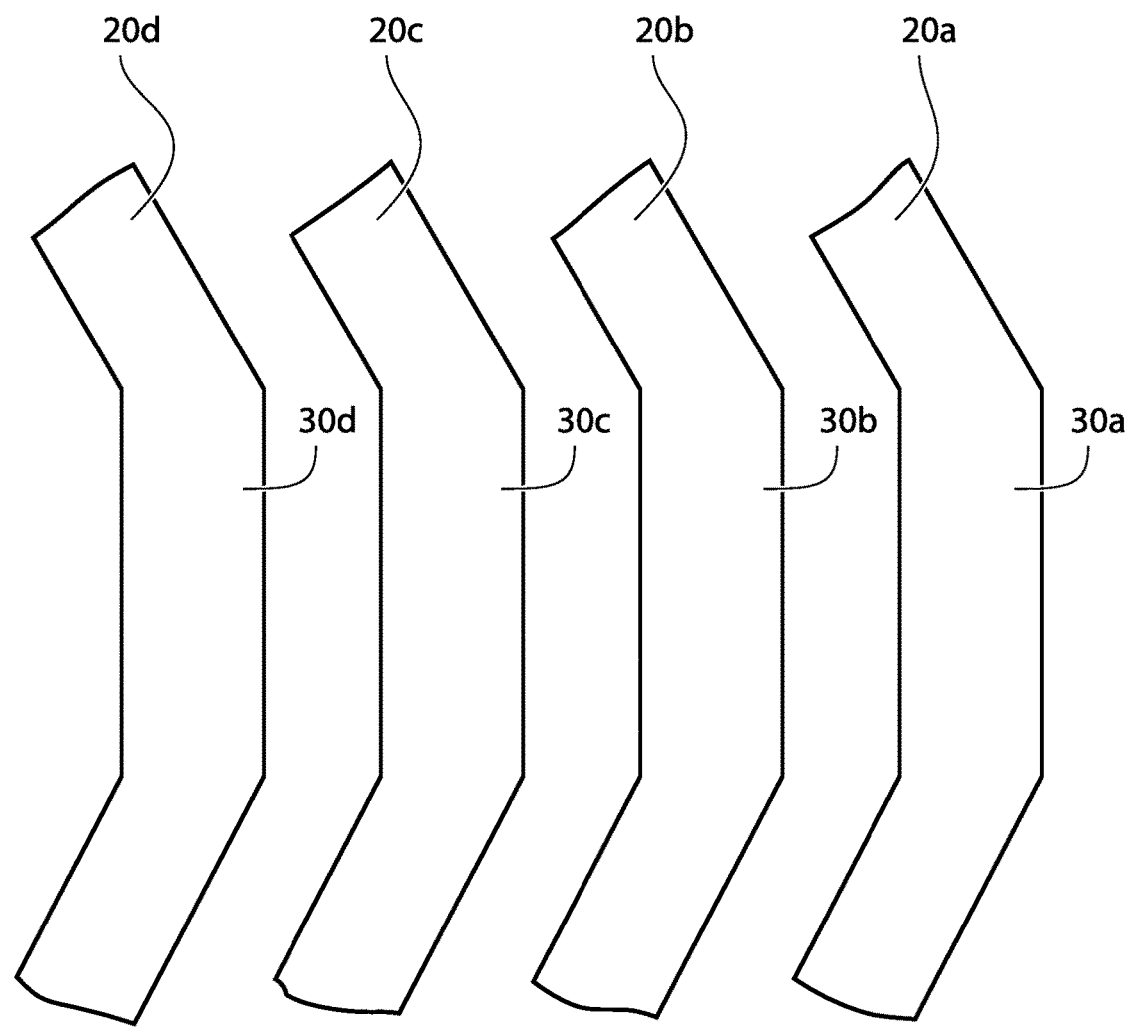
FIG. 1c shows an enlarged view of the section II in FIG. 1b.
Figure 1C:
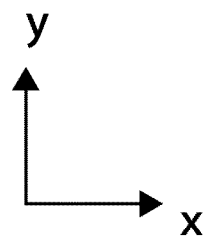

FIG. 1c shows an enlarged view of section II in FIG. 1b.

The second cantilever comprises a second lateral section 30b at a distal end of the second cantilever, i.e. next to the first lateral section 30a. The second lateral section extends substantially orthogonal to the first axis and is parallel to the first lateral section.

The third cantilever comprises a third lateral section 30c at a distal end of the third cantilever, i.e. next to the second lateral section—the second lateral section being between the first lateral section and the third lateral section.

The third lateral section extends substantially orthogonal to the first axis and is parallel to the first lateral section and the second lateral section.

The fourth cantilever comprises a fourth lateral section 30d at a distal end of the fourth cantilever, i.e. next to the third lateral section—the second lateral section and third lateral section being between the first lateral section and the fourth lateral section.

The fourth lateral section extends substantially orthogonal to the first axis and is parallel to the first, second and third lateral sections.

The four lateral sections constitute contact sections for abutting a test sample. The distance (pitch) between neighboring lateral sections is approximately 4 µm, i.e. the gap between the first lateral section and the second lateral section is 4 µm, and the same for the gap between the second and third lateral sections as well as between the third and fourth.

Figure 2A:
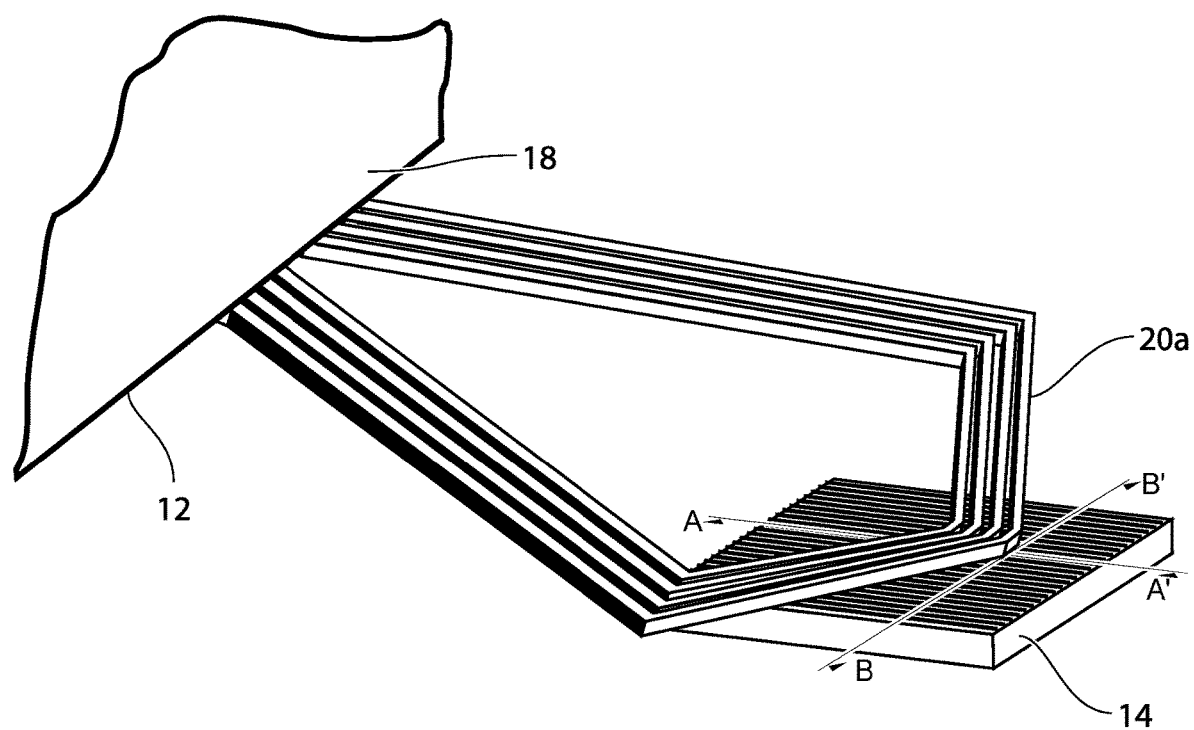
FIG. 2a is a perspective of a probe that has been put into contact with a test sample.

FIG. 2a is a perspective of a probe 10 that has been put into contact with a test sample 14.

The test sample is a semiconductor integrated circuit implemented with an array of fins oriented perpendicular to the lateral axis of the probe (y-direction of the reference coordinate system).

The probe is placed so that each of the first, second, third and fourth lateral sections abut the test sample surface.

Figure 2B:
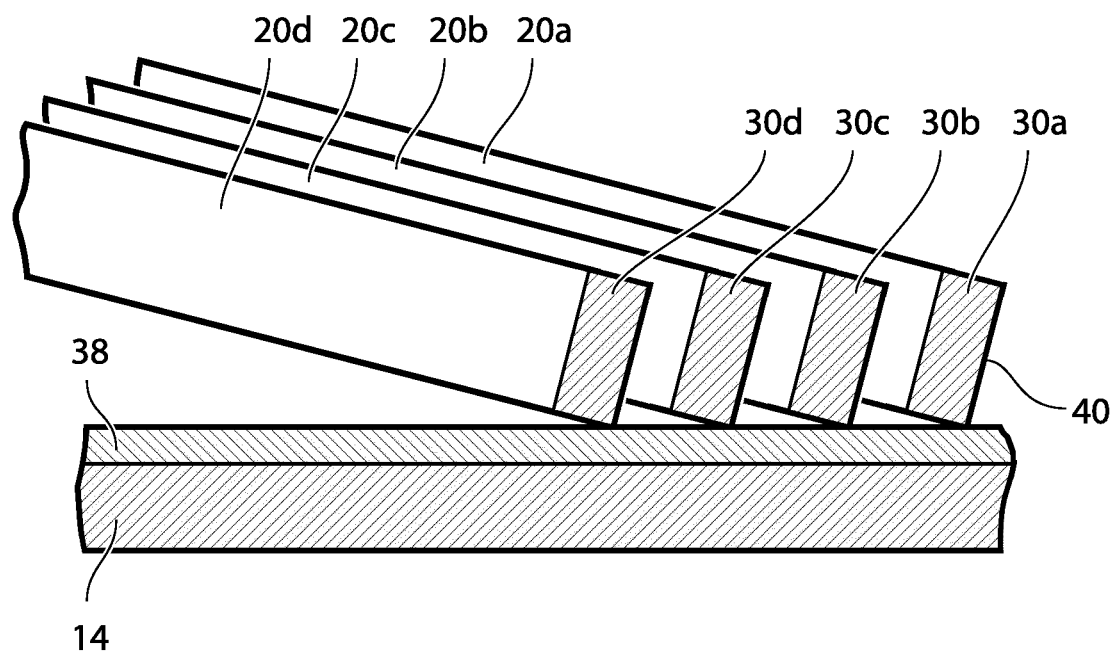

FIG. 2b shows the cross section A-A' in FIG. 2a through a fin 38 of the test sample 14. The fin has a rectangular cross section and extends along the x-direction of the reference coordinate system in FIG. 2b. A number of fins are placed in parallel along the y-direction.

Each of the first, second, third and fourth lateral sections (30a to 30d) are in contact with the fins.

The first lateral section 30a of a respective cantilever contacts the fin proximate a first corner of the first lateral section. The first corner of a respective first lateral section is the corner where the front side 40 of the first lateral section meets the cantilever surface facing the test sample during testing. A second corner of a respective first lateral section is defined as the corner where the side opposite the front side meets the cantilever surface facing the test sample during testing.

In the same way, the second lateral section 30b contacts the fin proximate a first corner of the second lateral section—where the front side of the second lateral section meets the cantilever surface of the second cantilever.

The third lateral section 30c contacts the fin proximate a first corner of the third lateral section—where the first side of the first lateral section meets the cantilever surface of the third cantilever.

The fourth lateral section 30d contacts the fin proximate a first corner of the first lateral section—where the first side of the first lateral section meets the cantilever surface of the fourth cantilever.

The distance between each contact point corresponds to the pitch, i.e. 3.5 µm in the reference coordinate system of FIG. 2b. The pitch is approximately 4 µm in the probe coordinate system, but 3.5 µm in the test sample coordinate system.

The probe is held so that the first plane/first cantilever has a first angle with respect to the test sample surface. The first angle is greater than 0° and less than 45°, typically 30°. The first cantilever is per definition flexible so the first angle may change depending on the engage depth that is used to put the first cantilever into contact with the test sample.

Similarly, the second cantilever has a second angle with respect to the test sample surface. The first angle is less than the second angle. This means that the cantilevers are not in parallel planes when all four are in contact with the test sample.

The first cantilever is more elastic than the second cantilever. Similarly, the second cantilever is more elastic than the third cantilever, and the third cantilever is more elastic than the fourth cantilever. At the final engage position each of the cantilevers contacts the test sample with approximately the same contact force (typically 100 µN), and each of the cantilevers will engage down into the test sample with corresponding depths (typically 8 µm for the first cantilever and 2 µm for the last when the contact force is 100 µN).

FIG. 2c shows the cross section B-B' in FIG. 2a. In the cross section, twelve fins extend parallel to each other. The fins are constituted by ribs projecting from a substrate. The first lateral section 30a is forced into contact with the test sample and abuts five fins. The contact force is thereby distributed over five fins, i.e. the pressure on each fin is lowered proportionally with the number of fins the first lateral section abuts.

Similarly, the second lateral section 30b, the third lateral section 30c, and the fourth lateral section 30d are each forced into contact with the test sample for contacting a number of fins. It may vary how many fins an individual lateral section is contacting.

The existence of insulating native oxide layers on the semiconducting fins and possibly also on the probe metallization may result in poor electrical contact between the probe and the fins.

A low ohmic contact between a fin (or other part of a semiconductor) and a cantilever (contact probe) is established by ramping up the potential between any pair of cantilevers (contact probes)—such as the first and the second cantilevers.

A pair of cantilevers/contact probes is to be understood as a first contact probe and a second contact probe.

As the potential is increased, it will at some point exceed the breakdown voltage of the insulating layers for an arbitrary fin (punch through), and a low resistance conducting path between the two cantilevers (contact probes) is established such that an electrical property of the fin can be determined.

For a four point measurement routine, a first pair of contact probes is used to inject a current into the fin, and a second pair of contact probes is used for voltage measuring.

To establish a low ohmic contact between the same single fin and all four cantilevers (contact probes), a proper sequence of breakdowns should be executed, i.e. between the first and second cantilever. Then the second and third cantilever, and finally the third and fourth cantilever.

In a situation where each cantilever has its own contact probe deposited thereon, there will be four cantilevers for the four point measurements. Each of the four cantilevers defines a loop with respect to the probe body, and the loops are within each other, i.e. there is an innermost loop and an outermost loop, and two loops in between.

The contact probe of the cantilever forming the outermost loop may be referred to as the first contact probe. The contact probe of the cantilever forming the second outermost loop may be referred to as the second contact probe. The contact probe of the cantilever forming the third outermost loop may be referred to as the third contact probe. The contact probe of the cantilever forming the fourth outermost loop (corresponding to the innermost loop out of the four loops) may be referred to as the fourth contact probe.

The four contact probes may be paired as current pairs and voltage pairs in a number of permutations, which are listed in the below table, where the numbers within the 12 cells in the double edged frame refer to the first, second, third, and fourth contact probes, respectively.

| Permutation | Current pair | Voltage pair |
| --- | --- | --- |
| 1 | 1, 2 | 3, 4 |
| 2 | 1, 3 | 2, 4 |
| 3 | 1, 4 | 2, 3 |
| 4 | 2, 3 | 1, 4 |
| 5 | 2, 4 | 1, 3 |
| 6 | 3, 4 | 1, 2 |

The expected voltage measurement for permutations 1 and 6 is zero because the current running between the current pair in those permutations does not go into the circuit established by the voltage pairs.

A first test may be conducted in order to ensure that all four contact probes are in contact with the same fin (and not more than one fin), i.e. so that no matter which pair of contact probes is used to inject a current, the current will run in the same fin. This may prevent a case where current runs from one fin over to another fin via a contact probe.

The test may compare resistances determined for a number of different permutations such as two or three or all of the four permutations, which does not return a zero result as described above, i.e. for example the resistance determined for permutation 2 may be compared to the resistance determined for permutation 3.

It may be decided that a proper contact exists between the same single fin and all four contact probes when the two resistance values (or measured voltages) are equal or at least does not deviate from each other with more than 10% such as more than 20%. The test may be expanded to compare the resistance values determined for three of the permutations or for all four of the non-zero permutations.

If one of the contact probes has contact with more than one fin, the resistances will be different from each other and it cannot be decided that there is a good contact between the same single fin and all four contact probes.

It may be the case that all four contact probes contact two fins. In such a case, the resistances will not deviate from each other, and the first test may not catch such a case.

A second test may be conducted in order to discard cases such as the above, where all four contact probes contact two fins. The second test may be a repetition of the first test a number of times, i.e. the four contact probes are landed on the test sample a number of times. For each landing, the resistances for a number of the permutations are compared, as explained in connection with the description of the first test. The second test may perform two landings or more such as five landings, up to ten landings or even more.

Any landings not fulfilling the first test may be discarded. The resistances for the non-discarded landings may then be compared and a dominant resistance value may be determined, i.e. if two or more of the landings return resistance values that are equal or at least do not deviate from each other with more than 10%, such as more than 20%, it may be decided that for those landings, the contact probes were in contact with the same single fin and the determined resistances are representative for the resistance of the fin.

Thus, the second test can be said to provide a population of landings for which the most likely resistance value can be derived—for example as the one occurring most frequently. Or an average of the resistance values which does not deviate with more than 10%, such as more than 20%.

The first voltage may be established by applying an alternating current between the first contact point and the second contact point having an amplitude value between 10 µA and 200 µA. The frequency of the alternating current may be between 1 kHz and 2 kHz. The first voltage may be greater than 0 V and less than 10 V. The first contact probe and the second contact probe may constitute a pair of electrodes used for injecting the alternating current in the test sample between the first contact point and the second contact point.

The probe may comprise a third contact probe and a fourth contact probe. The third contact probe may be placed in contact with the semiconductor wafer at a third contact point, and the fourth contact probe may be placed in contact with the semiconductor wafer at a fourth contact point.

A second voltage may be established between the first contact point and the third contact point by injecting a current in the test sample via the first contact probe and the third contact probe. The current may be defined with the same values as mentioned above.

Similarly, a third voltage may be established between the first contact point and the fourth contact point by injecting a current in the test sample via the first contact probe and the fourth contact probe.

A fourth voltage may be established between the first second point and the fourth contact point by injecting a current in the test sample via the second contact probe and the fourth contact probe.

Figure 3:
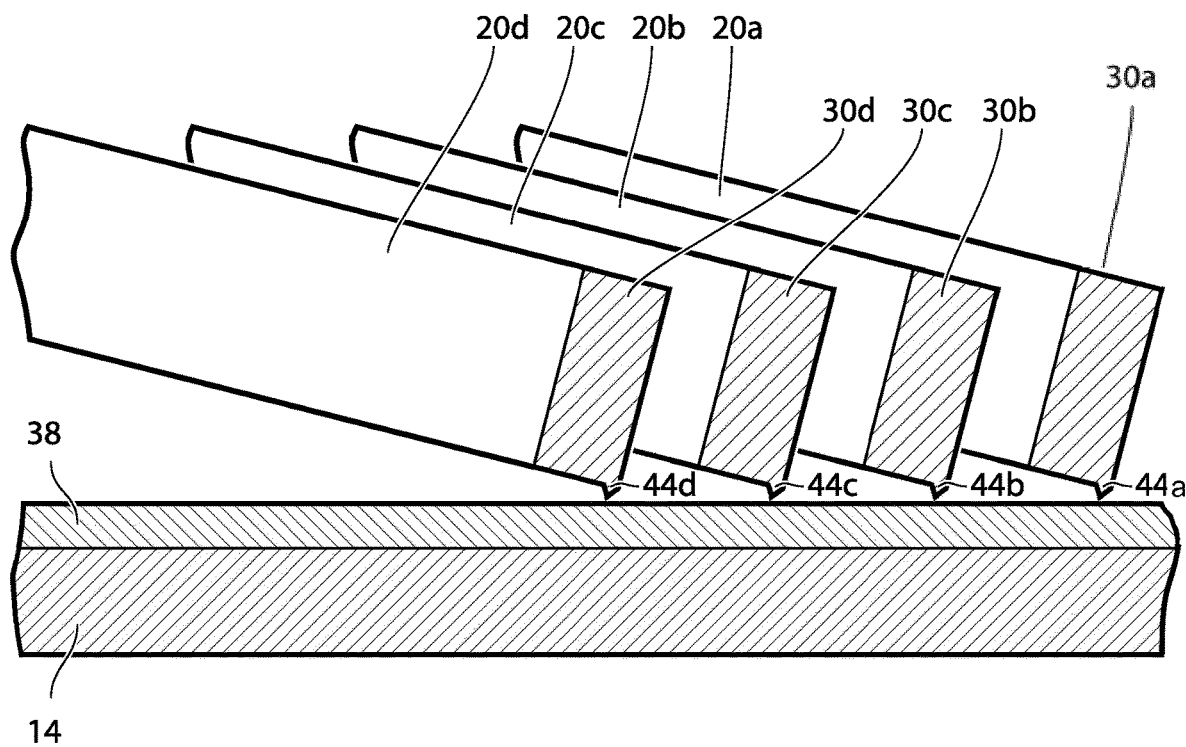
FIG. 3 shows a cross section of a distal end of a probe being held above a test sample.

FIG. 3 shows a perspective of a part of a probe, specifically a cross section of the first, second, third and fourth lateral sections 30a-d, which are forced into contact with a fin 38.

Part of the first lateral section 30a has been etched away, specifically part of the first lateral section facing the test sample during testing. Thus, leaving a first protrusion 44a facing towards a test sample during a test and extending along the length of the first lateral section in the lateral direction.

The first protrusion has a cross section with a normal in the lateral direction with a trapezoid geometry (polygon with four sides), specifically the geometry of an isosceles trapezoid. Thus, the first protrusion has a cross section with a wide base and a top being more narrow than the base—with the top facing the test sample when a test is performed. The width of the top measured orthogonal to the lateral direction is approximately between 20 nm and 200 nm.

The first protrusion has a height (measured as the distance between the top and the base) of about 500 nm.

The first protrusion can be formed, for example, by non-isotropic wet etch of properly aligned single crystal Si. Potassium hydroxide (KOH) may be used as etchant.

The metal film covers the first protrusion, i.e. the metal film conforms to the surface of the cantilever including the first protrusion on the first lateral section. Thus, a contact probe may end by projecting from the cantilever at the distal end towards the test sample during a test.

The first protrusion is proximate the first corner of the first lateral section, i.e. closer to the first corner than to the second corner.

Similarly as described above in connection with the first protrusion, a part of the second lateral section 30b has been etched away, specifically part of the second lateral section facing the test sample during a test. Thus, leaving a second protrusion 44b. The second protrusion has a height of about 500 nm. The second protrusion has a cross section with a normal in the lateral direction defining a trapezoid geometry, specifically the geometry of an isosceles trapezoid with a top facing the test sample when a test is performed. The second protrusion is approximate the first corner of the second lateral section.

A part of the third lateral section 30c has been etched away, specifically part of the third lateral section facing the test sample during a test. Thus, leaving a third protrusion 44c. The third protrusion has a height of about 500 nm. The third protrusion has a cross section with a normal in the lateral direction with a trapezoid geometry, specifically the geometry of an isosceles trapezoid.

Finally, a part of the fourth lateral section 30d has been etched away, specifically part of the fourth lateral section facing the test sample. Thus, leaving a fourth protrusion 44d. The fourth protrusion has a height of about 500 nm. The fourth protrusion has a cross section with a normal in the lateral direction with an isosceles trapezoid geometry.

With the above described first, second, third and fourth protrusions 44a-d, the contact areas (for abutting the test sample) of each of the cantilevers is thereby made smaller (compared to a situation without protrusions on the four lateral sections 30a-d), and the uncertainty of the distance between contact points with the test sample (pitch) is decreased. Furthermore, the roughness of the contact is lowered, thereby reducing the risk of damage to the fins, and a reliable contact with many of the fins is achieved.

Figure 4A:
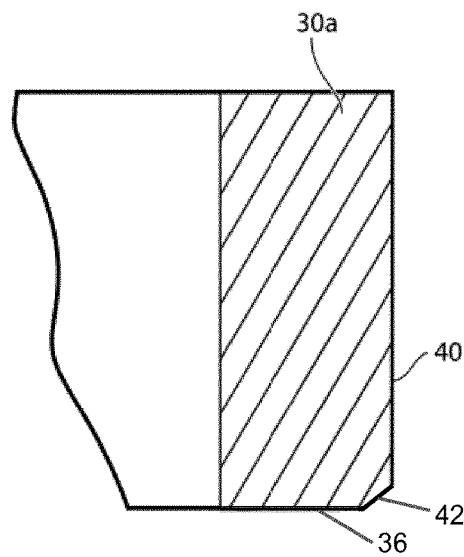
FIG. 4a shows a cross section of a cantilever of the probe.

FIG. 4a shows a perspective of a part of a probe, specifically a cross section of the first lateral section 30a.

A part of the first lateral section has been etched away, i.e. the first corner has been rounded/cut off. Specifically, an etchant is applied on the cantilever surface closest to the front side of the first lateral section. The etching increases in depth into the first lateral section, as the distance to the front side gets smaller. Thereby providing a face 42 between the cantilever surface and the front side, the face having an internal angle with respect to the cantilever surface being greater than 90°, i.e. an obtuse angle. This is advantageous, because it simplifies the fabrication process compared to the fabrication of the probe with the protrusion shown in FIG. 3 in which the protrusion has an isosceles trapezoid geometry.

Similarly, a part of the second lateral section has been etched away. Specifically, the first corner of the second lateral section has been rounded/cut off.

Furthermore, the first corner of the third lateral section has been rounded/cut off. Finally, the first corner of the fourth lateral section has been rounded/cut off.

Figure 4B:
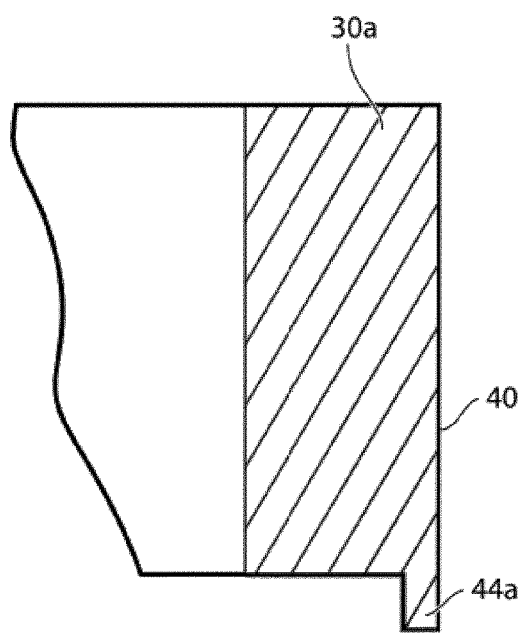
FIG. 4b shows a cross section of a cantilever of the probe.

FIG. 4b shows a perspective of a part of a probe, specifically a cross section of the first lateral section 30a.

Part of the first lateral section has been etched away, specifically a part of the first lateral section facing the test sample during a test. Thus, leaving a first protrusion 44a. The first protrusion has a height of about 500 nm. The first protrusion has a cross section with a normal in the lateral direction with a rectangle geometry.

The first protrusion is approximate the first corner of the first lateral section, i.e. closer to the first corner than to the second corner.

Similarly, a part of the second lateral section 30b has been etched away leaving a second protrusion 44b with a height of about 500 nm, and a cross section with a normal in the lateral direction with a rectangle geometry. The second protrusion is proximate the first corner of the second lateral section.

A normal is to be understood in the geometrical sense, i.e. as a line or vector, which is orthogonal to a plane (or a cross section in a plane).

A part of the third lateral section 30c has been etched away leaving a third protrusion 44c with a height of about 500 nm, and a cross section with a normal in the lateral direction with a rectangle geometry. The third protrusion is proximate the first corner of the third lateral section.

Finally, a part of the fourth lateral section 30d has been etched away leaving a fourth protrusion 44d with a height of about 500 nm, and a cross section with a normal in the lateral direction with a rectangle geometry. The fourth protrusion is proximate the first corner of the fourth lateral section.

Figure 5:
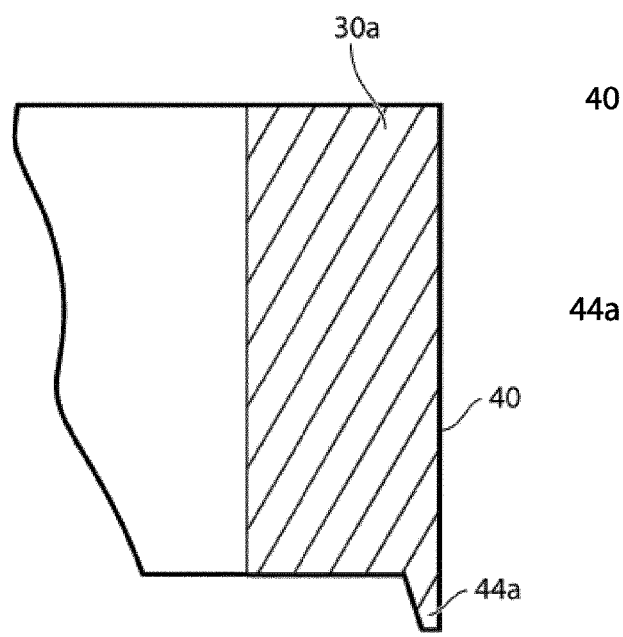
FIG. 5 shows a cross section of a cantilever of the probe.

FIG. 5 shows a perspective of a part of a probe, specifically a cross section of the first lateral section 30a.

A part of the first lateral section has been etched away, specifically a part of the first lateral section facing the test sample. Thus, leaving a first protrusion 44a. The first protrusion has a height of about 500 nm. The first protrusion has a cross section with a normal in the lateral direction with a geometry of a right trapezoid (trapezoid having two right angles). The first protrusion has a wide base and a top being more narrow than the base—with the top facing the test sample when a test is performed.

The side of the first protrusion with the two right angles is approximate the first corner of the first lateral section, i.e. closer to the first corner than to the second corner.

Similarly, a part of the second lateral section 30b has been etched away leaving a second protrusion 44b with a height of about 500 nm, and a cross section with a normal in the lateral direction with a right trapezoid geometry. The second protrusion is proximate the first corner of the second lateral section.

A part of the third lateral section 30c has been etched away leaving a third protrusion 44c with a height of about 500 nm, and a cross section with a normal in the lateral direction with a right trapezoid geometry. The third protrusion is proximate the first corner of the third lateral section.

Finally, a part of the fourth lateral section 30d has been etched away leaving a fourth protrusion 44d with a height of about 500 nm, and a cross section with a normal in the lateral direction with a right trapezoid geometry. The fourth protrusion is proximate the first corner of the fourth lateral section.

FIG. 6a shows a perspective of a part of a probe, specifically a perspective of the distal end of the probe seen from the test sample when the probe is held above the test sample, i.e. looking at the cantilever surface.

Figure 6B:
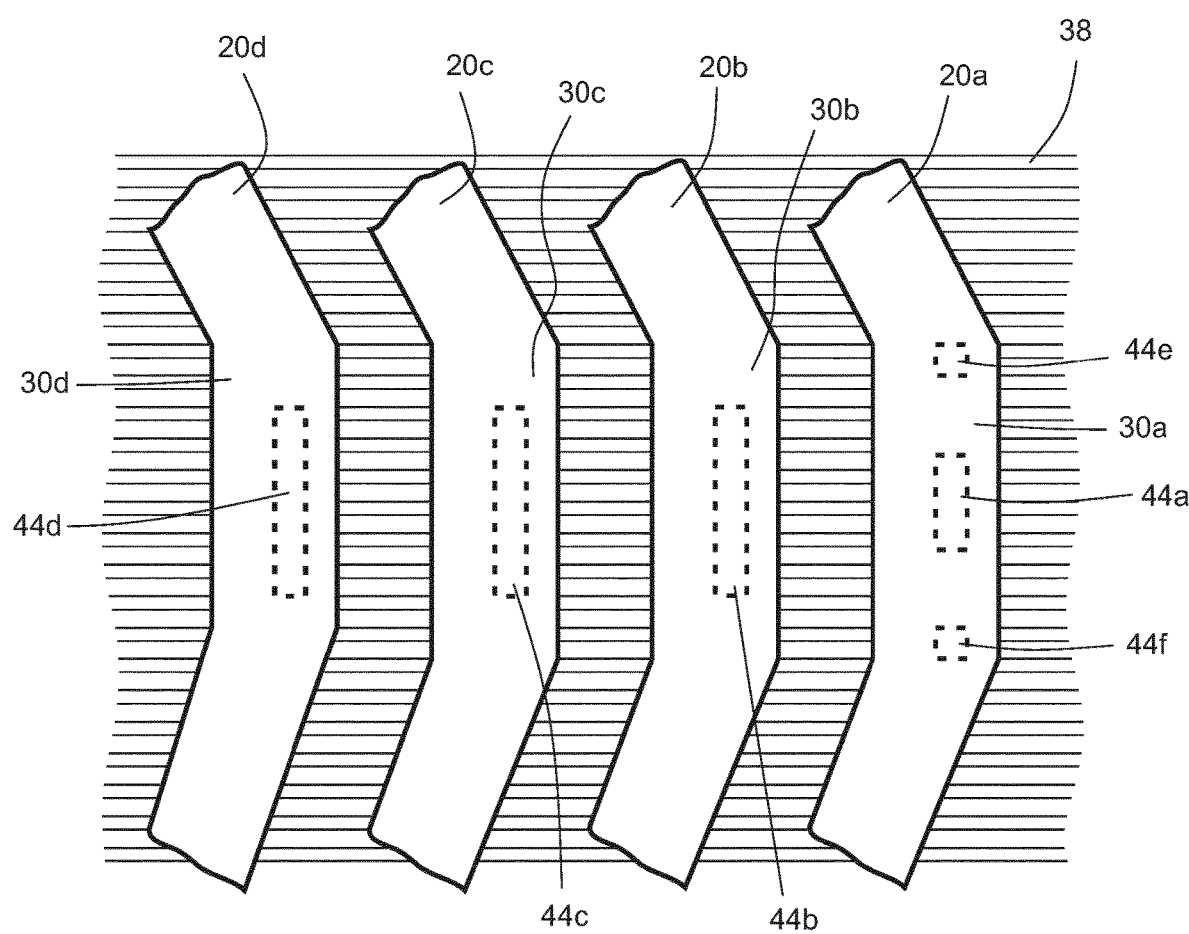
FIG. 6b shows a perspective of the probe illustrated in FIG. 6a where the probe is held above a test sample.

FIG. 6b shows a perspective of a part of the probe shown in FIG. 6a, specifically a perspective of the distal end of the probe seen from above (over the test sample when the probe is held above the test sample).

The first lateral section comprises a first protrusion 44a, which has a first length in the lateral direction. The first length being less than the overall length of the first lateral section, specifically less than a third of the length of the first lateral section. The first protrusion covers approximately three fins and the first length is between 0.1 µm and 2 µm. The first protrusion is approximately at a midpoint of the first lateral section.

Since the first length of the first protrusion is less than the length of the first lateral section, the number of fins, which the first cantilever can come into contact with, is reduced compared to an embodiment where the first protrusion extends longer along the length of the first lateral section.

The second lateral section comprises a second protrusion 44b approximately at a midpoint of the second lateral section. The second protrusion has a second length in the lateral direction. The second length is greater than the first length of the first protrusion.

The first protrusion projects onto the second protrusion in the direction of the first axis. The first protrusion and the second protrusion can therefore come into contact with the same fin.

Similarly, the third lateral section comprises a third protrusion 44c approximately at a midpoint of the third lateral section. The third protrusion has a third length in the lateral direction. The third length is greater than the first length.

The first protrusion projects onto the third protrusion in the direction of the first axis. The third protrusion can therefore also come into contact with the same fin as the first and second protrusions contact.

Finally, the fourth lateral section comprises a fourth protrusion 44d approximately at a midpoint of the fourth lateral section. The fourth protrusion has a fourth length in the lateral direction. The fourth length is greater than the first length.

The first protrusion projects onto the fourth protrusion in the direction of the first axis. The fourth protrusion can therefore also come into contact with the same fin as the first, second and third protrusions contact.

The first lateral section comprises a fifth protrusion 44e and a sixth protrusion 44f. The fifth and sixth protrusions constitute landing areas for distributing the contact force.

The fifth protrusion is closer to the first end of the first lateral section than to the second end of the first lateral section. The sixth protrusion is closer to the second end of the first lateral section than to the first end of the first lateral section. The first protrusion is between the fifth protrusion and the sixth protrusion.

The first protrusion is separate from the fifth protrusion and the sixth protrusion, and the fifth and sixth protrusions may be electrically insulated from any of the first, second, third and fourth protrusions.

The fifth protrusion has a fifth length in the lateral direction less than a third of the length of the first lateral section. The sixth protrusion has a sixth length in the lateral direction less than a third of the length of the first lateral section.

The second protrusion is within the projection of the fifth and sixth protrusions on the second lateral section. Similarly, the third protrusion is within the projection of the fifth and sixth protrusions on the third lateral section, and the fourth protrusion is within the projection of the fifth and sixth protrusions on the fourth lateral section.

FIG. 7a shows a perspective of a part of a probe, specifically a perspective of the distal end of the probe seen from the test sample when the probe is held above the test sample, i.e. looking at the cantilever surface.

Each cantilever comprises a first contact probe/electrode 52a, and a second contact probe/electrode 52b, which are electrically insulated from each other. In this way, two different fins can be contacted simultaneously as the respective lateral sections abut the test sample. Among other things, the insulation between two fins can then be measured. Alternatively, a single fin can be contacted at two different points by the same cantilever. This can be used to distribute several contact points on the wafer surface and also on planar surface without fins.

The first contact probe as well as the second contact probe of a respective cantilever can be made by coating a metal film on the surface of the cantilever, and structuring the metal film, so that the middle part of the surface of the lateral section of the cantilever comprises an electrical insulator between the two contact probes, i.e. the middle part of the surface of each lateral section is void of metal film. The metal film can be structured using lift off technique.

Alternatively, the two contact probes can be made by forming lines at a plane above a cantilever surface where shadow effect is used to insulate metal lines from each other.

Figure 7B:
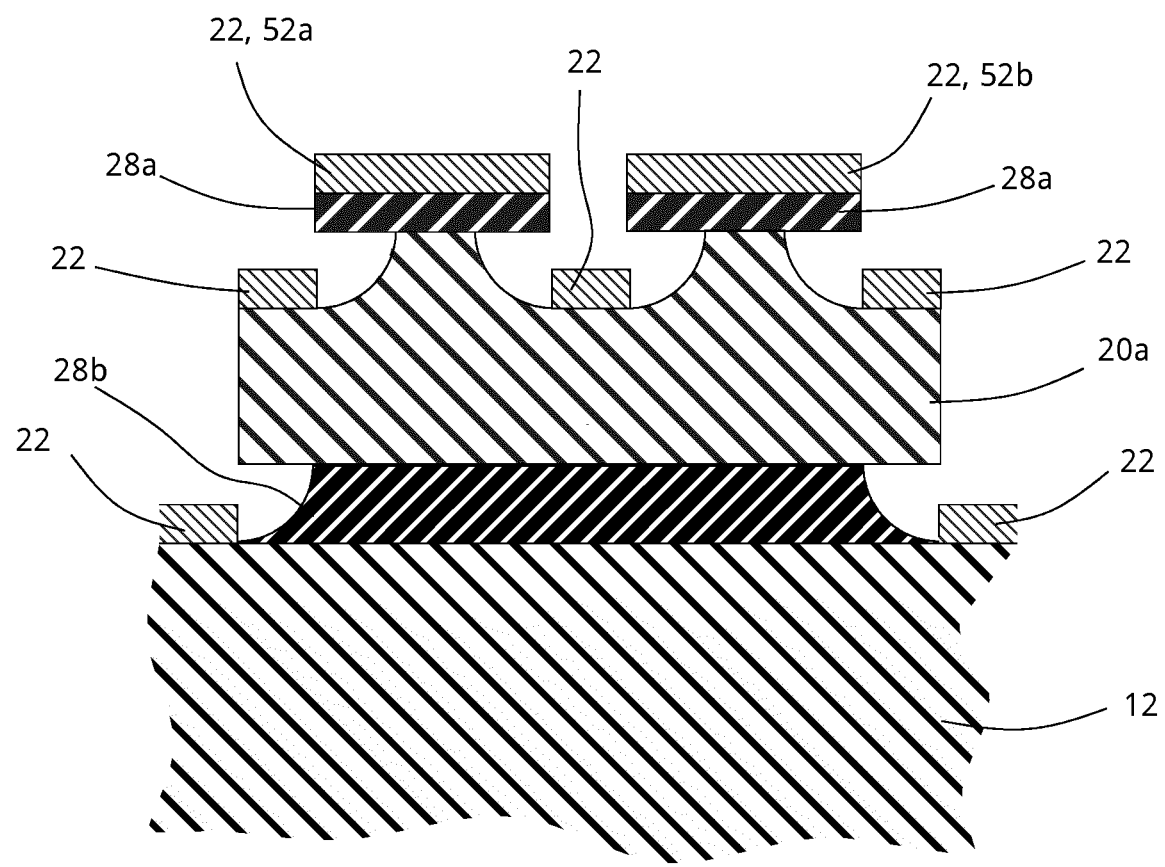
FIG. 7b shows part of a cross section of a part of a probe.

FIG. 7b shows a part of a cross section of a part of a probe. The probe has a number of loop cantilevers as can be seen in FIG. 1b, and at least one of the cantilevers supports two contact probes, which extend from the proximal end of the cantilever towards the distal end of the cantilever. The two contact probes extend parallel to each other along the cantilever. The cross section is in the plane where the cantilever is supported by the probe body, specifically the section around the first point, where the first loop starts on the probe body.

The probe body 12, and the cantilever 20a are made of silicon (Si). The cantilever is electrically insulated from the probe body by a buried electric insulator 28b, which may be made of silicon-dioxide ($SiO_2$). A typical thickness of the buried electric insulator is 300 nm to 1000 nm.

The cantilever has a topography with a first protuberance and a second protuberance for supporting the first contact probe 52a and the second contact probe 52b respectively.

The first contact probe 52a is made of a metal film 22, and electrically insulated from the cantilever by a top electric insulator 28a, which may be made of low stress silicon nitride (SiN), i.e. deposited in a low pressure chemical vapor deposition process.

Similarly, the second contact probe 52b is made of a metal film 22, and electrically insulated from the cantilever by a top electric insulator 28a, which may also be made of low stress silicon nitride In the fabrication, the buried electric insulator is deposited or grown on the probe body, and the cantilever layer is deposited or bonded on the buried electric insulator. The top electric insulator is deposited or grown on the cantilever layer.

In a first lithography step, the top electric insulator as well as part of the first cantilever are etched in order to define and form the outline of the first and second contact probe.

An anisotropic etch produces vertical sidewalls of the top electric insulator.

An isotropic etch produces round sidewalls of the first and second protuberances, i.e. an underetch of the cantilever is performed with respect to the top electric insulator so that the top electric insulator has overhangs with respect to the first and second protuberances, i.e. the top electric insulator cast a shadow down on the cantilever. The top electric insulator may have some stress that can deform the free hanging cantilevers, which can be circumvented by having a thinner top electric insulator (i.e. 50 nm) on the free hanging cantilevers and a thicker dielectric layer on the rest of the probe (i.e. 300 nm). It is also likely that lateral under etch will be smaller (i.e. 100 nm) on the free hanging cantilevers where the contact probes are narrow (down to 300 nm) and larger on the rest of the probe (i.e. 500 nm) to reduce risk of leak currents to the body due to contamination and defects.

In a second lithography step, the first cantilever and the buried electric insulator are etched. An isotropic etch produces round sidewalls of the buried electric insulator, i.e. the buried electric insulator is etched so that the cantilever has overhangs with respect to the buried electric insulator, i.e. cast a shadow on the buried electric insulator.

In a third step, the probe body 12 is formed by lithography on the back side of the wafer and etching the silicon all the way through the wafer.

In the last fabrication process the metal film 22 is deposited. The metal deposition done at the end of the process forms the contact probes, which are electrically insulated from each—due to the shadowing of the respective overhangs.

Figure 8A:
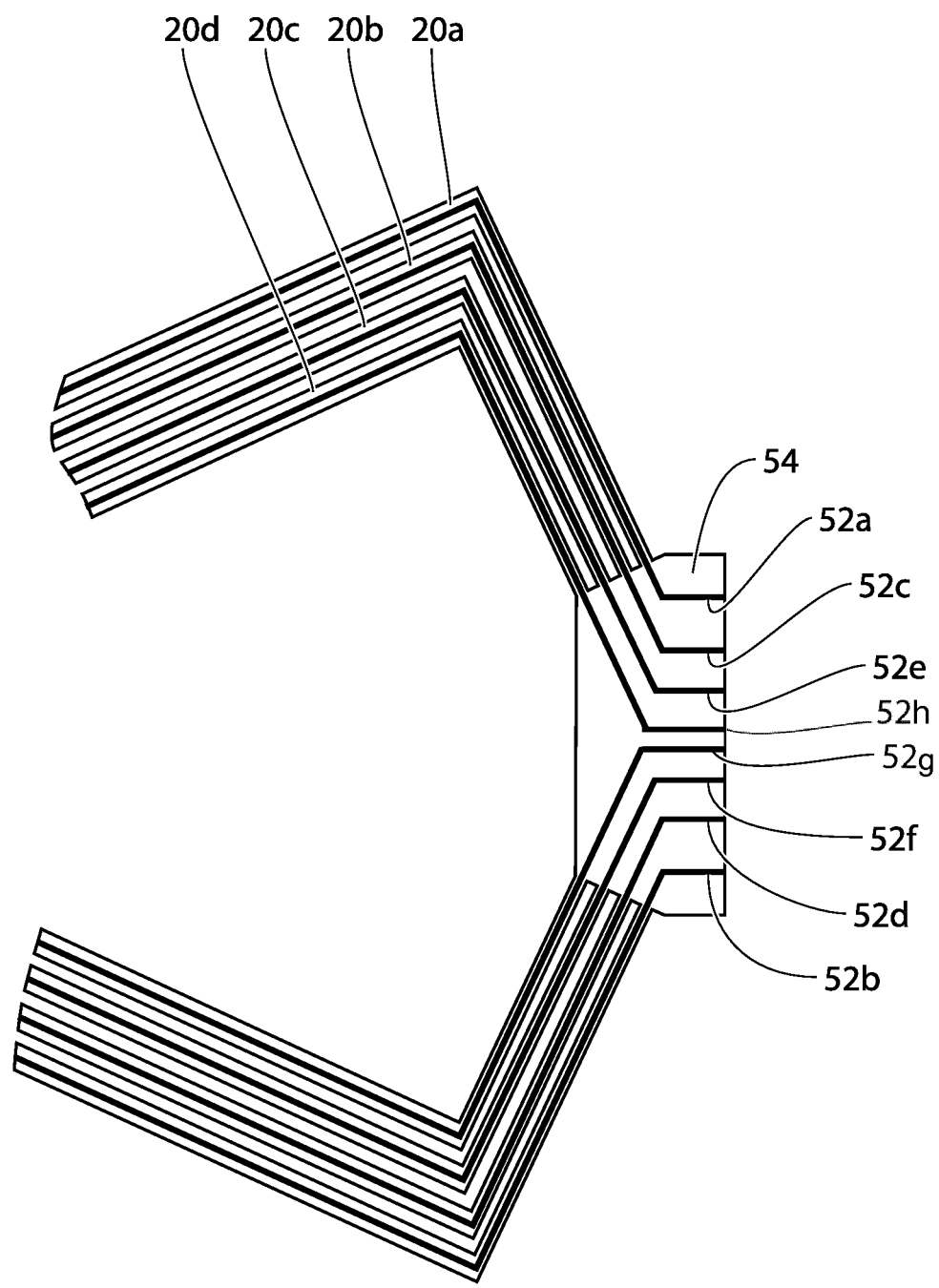
FIG. 8a shows a perspective of probe comprising a mono-cantilever.

FIG. 8a shows a perspective of a part of a probe, specifically a perspective of the distal end of the probe seen from the test sample when the probe is held above the test sample, i.e. looking at the cantilever surface.

The probe comprises four cantilevers, which are joined together at the distal end of the probe to form a mono-cantilever body 54.

The first cantilever supports a first contact probe and a second contact probe similar to the probe illustrated in FIG. 7a.

The second cantilever supports a third contact probe 52c and a fourth contact probe 52d.

The third cantilever supports a fifth contact probe 52e and a sixth contact probe 52f.

Finally, the fourth cantilever supports a seventh contact probe 52g and an eighth contact probe 52h.

The eighth contact probes extends parallel to the first axis on a mono-cantilever surface, and ends proximate a first edge of the mono-cantilever body 54.

The distance between the ends of the contact probes along the first edge may be less than 1 μm.

In an embodiment the mono-cantilever may support up to twelve contact probes.

FIG. 8b shows a perspective of a part of a probe, specifically a perspective of the distal end of the probe seen from the test sample when the probe is held above the test sample, i.e. looking at the cantilever surface.

The seventh and eighth contact probes are adjoined and used as a strain gauge 56, which is formed by metal film on the fourth cantilever, the metal film forming the strain gauge extends further from the fourth cantilever on the mono-cantilever surface to the first edge of the mono-cantilever body between the fifth contact probe and the sixth contact probe. As the fourth cantilever is strained the resistance of the metal film forming the strain gauge changes, thereby reflecting changes in forces applied to the fourth cantilever.

The distance between the ends of the contact probes along the first edge may be less than 1 μm.

Figure 9A:
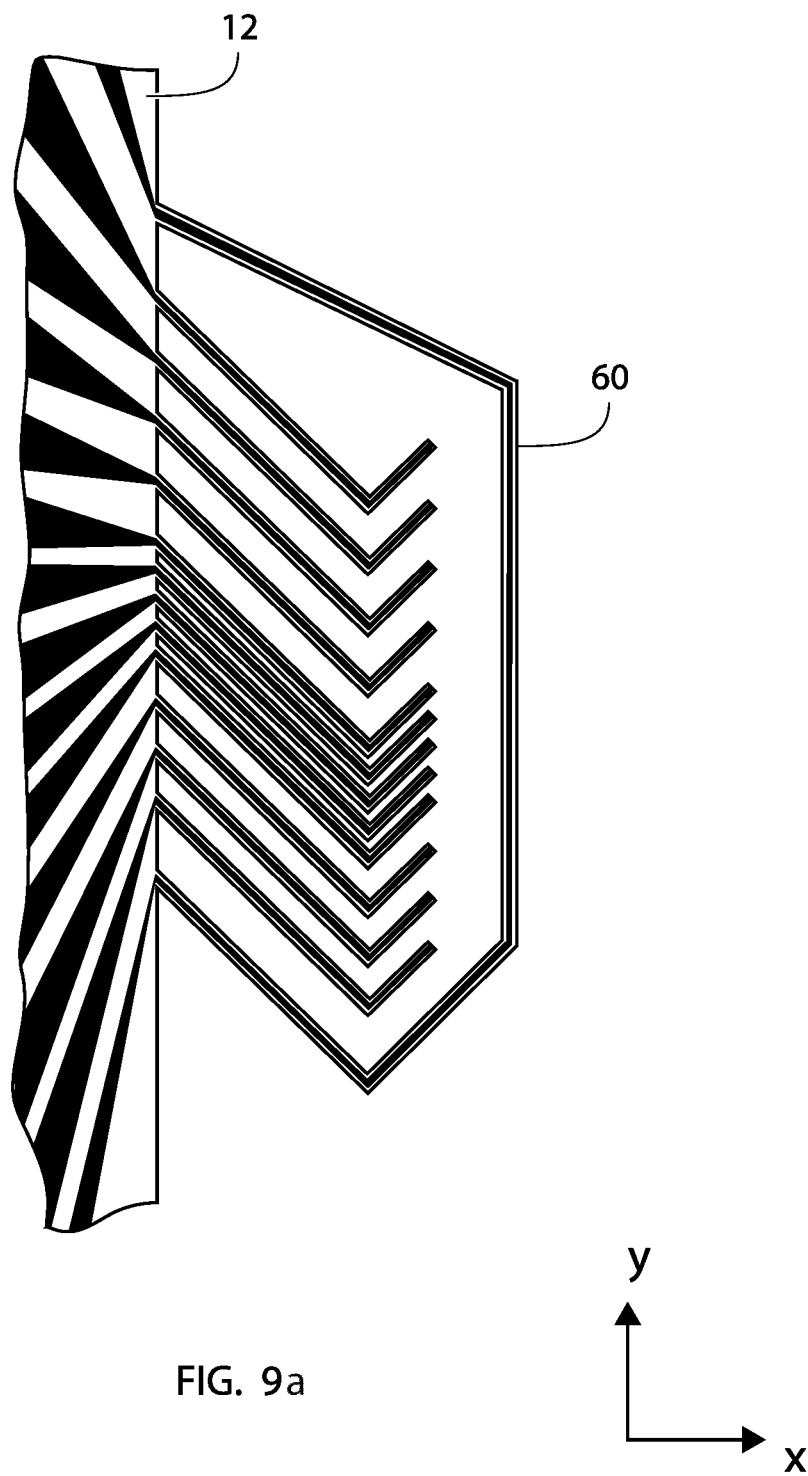
FIG. 9a shows a perspective of part of a probe for generating a magnetic field.

FIG. 9a shows a perspective of a part of a probe comprising an arm 60 extending from the probe body. The first arm defines a loop with respect to the probe body, i.e. the first arm ends and begins at the probe body. The first arm extends in a plane substantially parallel to a planar body surface of the probe.

The probe comprises a number of cantilevers extending from the probe body in a cantilever plane, which is also parallel with the planar body surface—each cantilever having a contact probe for contacting a test sample. In FIG. 9a eight cantilevers are illustrated. The cantilevers extend parallel to each other, and each has a L-shaped geometry in the plane in which they extend. Alternatively, each cantilever may be constituted by a single beam section extending in a substantially straight line from the probe body.

The plurality of cantilevers can be also replaced by one of the designs described in FIGS. 8a and 8b.

Each cantilever is within a projection of the arm onto the plane in which the cantilever extend.

The arm is illustrated as being asymmetric with respect to the x-axis (first axis). However, in an embodiment the arm may be symmetric with respect to the first axis.

During testing of a test sample, a current (current loop) is excited in the arm (loop) for generating a magnetic field, which at the intersection with the cantilever plane is substantially perpendicular to the cantilever plane. Specifically, the cantilevers and the first arm extend such that when the probe is placed in contact with a test sample, the magnetic field is substantially perpendicular to a surface plane of the test sample.

In this way the probe can be used for measuring magnetoresistance directly on blanket magnetic tunnel junction stacks for magnetic random access memory, and thereby measure the tendency of the magnetic storage elements to change the value of their electrical resistance in an externally-applied magnetic field.

For example, a magnetic field greater than 50 mT is required up to 10 μm away from the current loop in order to switch a MTJ. This field can be generated by a current pulse of 2.5 A. A current pulse as short as 1 μsec should be sufficient to switch the MTJ and it should be therefore possible to switch the MTJ at a fast rate and by that reduce the measurement time.

In many cases the magnetic field required to switch the MTJ has a large offset (i.e. >100 mT) while a small additional magnetic field is required to actually switch the MTJ back and forth. It is therefore an option to add an external magnet that can provide the offset and use the current loop only to provide the smaller magnetic field needed for switching the MTJ.

The current loop should be provided with thick conducting metal film (i.e. 1 μm thick) that can be deposited by electroplating process on the first arm.

Figure 9B:
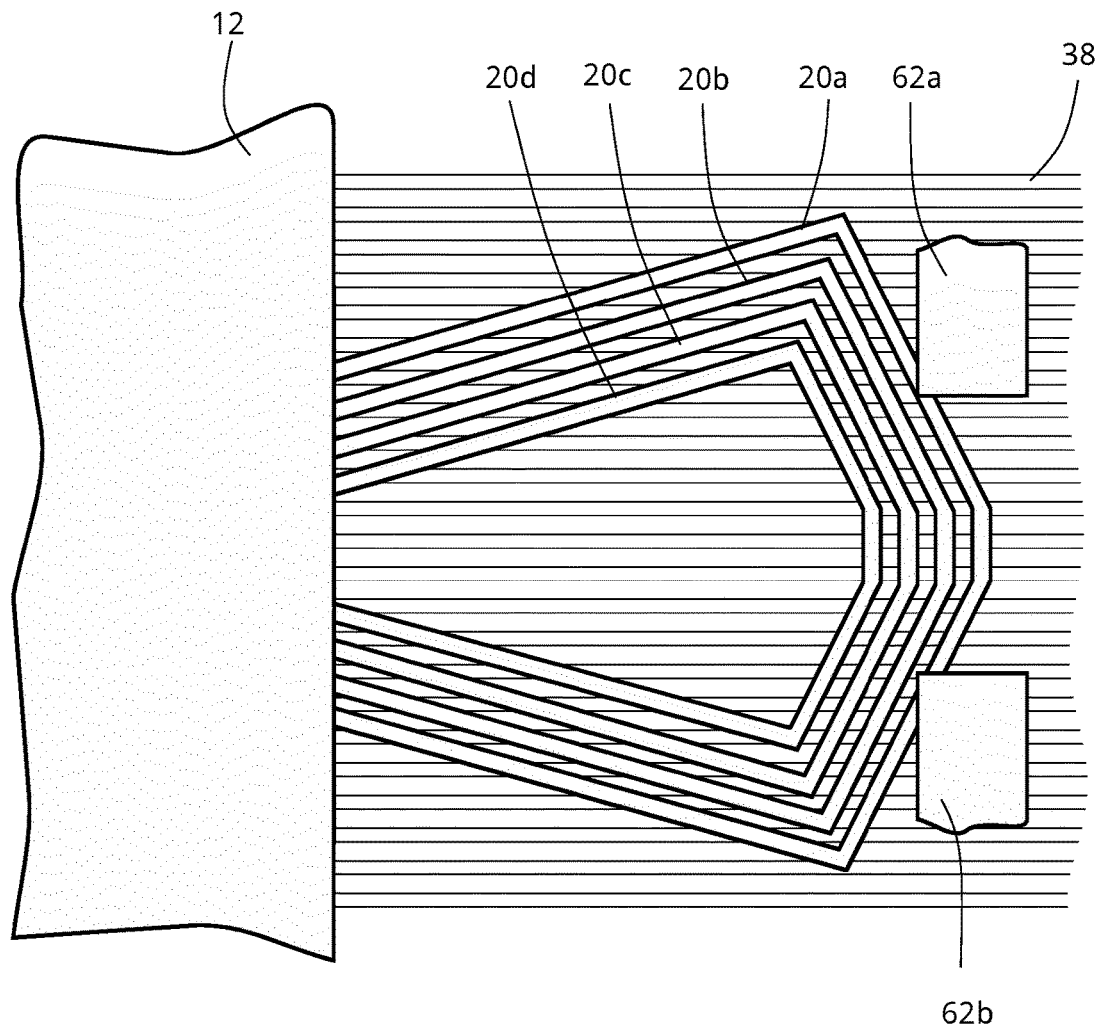
FIG. 9b shows a perspective of an assembly comprising a probe and a magnet.

FIG. 9b shows a perspective of a probe, which is held over a test sample comprising a number of fins 38.

The probe is illustrated with four cantilevers 20a-d extending from a probe body 12. Each cantilever forms a loop with respect to the probe body. The loops are within each other as is also illustrated in FIG. 1b.

Each cantilever has a lateral section at a distal end (the end furthest from the probe body). The probe is placed such that each lateral section of the cantilevers is in contact with a fin.

The probe is supplemented with a magnet, which can be a permanent magnet. The magnet in the assembly is held above the test sample, and it is orientated so that a magnetic field produced by the magnet (in the plane of the fins) is orthogonal to the longitudinal direction of the fins.

In FIG. 9b the magnet is shown with a first magnet element (pole) 62a and second magnet element (pole) 62b symbolising a horseshoe magnet. The magnet is placed so that at least one of the lateral sections is between the first magnet element and the second magnet element.

The magnetic field can change the flow of charged carriers in the fins during a measurement, which can be detected via the change in the measured fin resistance. The technique can be used to evaluate the mobility and concentration of carriers in the fins.

Figure 10:
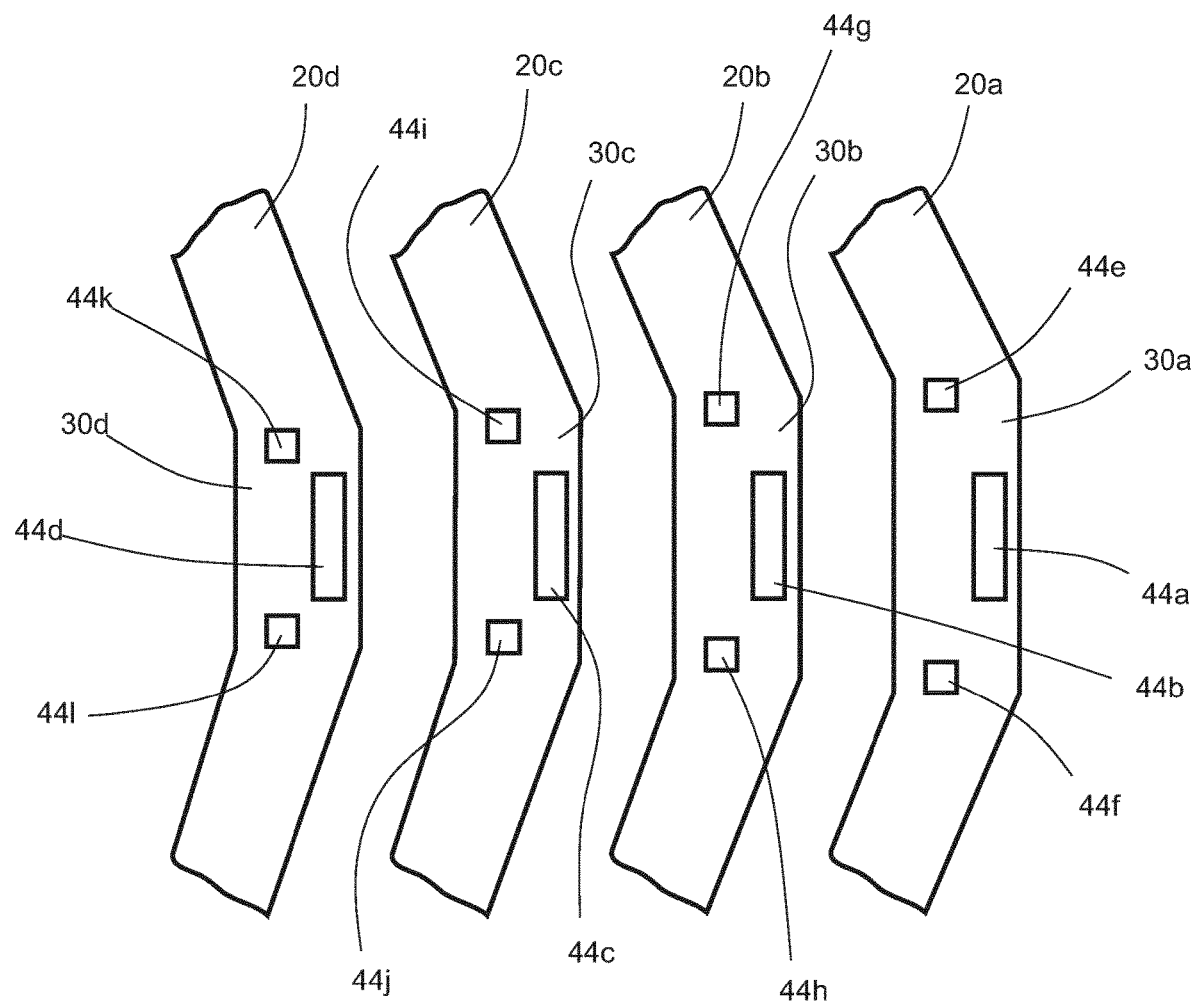
FIG. 10 shows a perspective of a distal end of a probe.

FIG. 10 shows a perspective of part of a probe, specifically a perspective of the distal end of the probe seen from the test sample when the probe is held above the test sample, i.e. looking at the cantilever surfaces.

The length of the first lateral section 30a in the lateral direction is greater than the length of the second lateral section 30b in the lateral direction.

The length of the second lateral section in the lateral direction is greater than the length of the third lateral section 30c in the lateral direction.

The length of the third lateral section in the lateral direction is greater than the length of the fourth lateral section 30d in the lateral direction.

The first lateral section comprises a first protrusion 44a for contacting a fin. The first protrusion is covered with a metal film constituting the first contact probe. Thus, the contact probe may end by projecting from the cantilever at the distal end towards the test sample during a test. The second lateral section comprises a second protrusion 44b. The third lateral section comprises a second protrusion 44c, and the fourth lateral section comprises a second protrusion 44d.

The first, second, third and fourth protrusions project onto each other so that they can come into contact with the same fin.

The first lateral section comprises a fifth protrusion 44e and a sixth protrusion 44f, which constitute landing areas for aligning the lateral section with the surface of the test sample, i.e. if the probe is approaching the test sample in such a way that the first lateral section is not in a plane parallel with the surface of the test sample, either the fifth or sixth protrusion can provide the first contact with the test sample, and define a pivot point so that the first lateral section rotates into a plane substantially parallel with the surface of the test sample.

The first protrusion is between the fifth and sixth protrusions. The first protrusion may be closer to the front side 40 of the first lateral section than the fifth and sixth protrusions. In addition, the first protrusion may be higher than the height of the fifth and sixth protrusions. This may in-crease the likelihood of establishing a good contact between the first contact probe and the fin.

The second lateral section comprises a seventh protrusion 44g and an eighth protrusion 44h, which constitute landing areas for aligning the lateral section with the surface of the test sample.

The second protrusion is between the seventh and eighth protrusions. The second protrusion may be closer to the front side of the second lateral section than the seventh and eighth protrusions—the front side of the second lateral section being the side which is closest to the first lateral section seen along the first axis. In addition, the second protrusion may be higher than the height of the seventh and eighth protrusions.

The distance between the seventh and eighth protrusions is smaller than the distance between the fifth and sixth protrusions.

The third lateral section comprises a ninth protrusion 44i and a tenth protrusion 44j, which constitute landing areas for aligning the lateral section with the surface of the test sample. The distance between the ninth and tenth protrusions is smaller than the distance between the seventh and eighth protrusions.

The third protrusion is between the ninth and tenth protrusions. The second protrusion may be closer to the front side of the third lateral section than the ninth and tenth protrusions. In addition, the third protrusion may be higher than the height of the ninth and tenth protrusions.

The fourth lateral section comprises an eleventh protrusion 44k and a twelfth protrusion 44l, which constitute landing areas for aligning the lateral section with the surface of the test sample. The distance between the eleventh and twelfth protrusions is smaller than the distance between the ninth and tenth protrusions.

The fourth protrusion is between the eleventh and twelfth protrusions. The fourth protrusion may be closer to the front side of the fourth lateral section than the eleventh and twelfth protrusions. In addition, the fourth protrusion may be higher than the height of the eleventh and twelfth protrusions.

The eight protrusions 44e-l constituting the landing areas for the four lateral sections 30a-d may be electrically insulated from any of the first, second, third and fourth protrusions 44a-d.

Items

1. A probe for testing an electrical property of a test sample, said probe comprising:
    a probe body having a first side defining a substantially planar body surface,
    a first cantilever extending from said probe body, and having a proximal end at said probe body and a distal end, said distal end being opposite to said proximal end,
    said first cantilever defining a first loop with respect to said probe body, said first loop extending in a first plane substantially parallel to said planar body surface,
    a first contact probe being supported by said first cantilever,
    a second contact probe being electrically insulated from said first contact probe,
    said second contact probe being supported by said first cantilever or by a second cantilever extending from said probe body towards said distal end,
    said second cantilever defining a second loop with respect to said probe body, said second loop extending in a second plane substantially parallel to said first plane, and
    said second loop being within a projection of said first loop onto said second plane.

2. The probe according to item 1, comprising a third cantilever extending from said probe body towards said distal end,
    said third cantilever defining a third loop with respect to said probe body, said third loop extending in a third plane substantially parallel to said second plane,
    wherein said third loop is within a projection of said second loop onto said third plane.

3. The probe according to item 2, comprising a fourth cantilever extending from said probe body towards said distal end,
    said fourth cantilever defining a fourth loop with respect to said probe body, said fourth loop extending in a fourth plane substantially parallel to said third plane,
    wherein said fourth loop is within a projection of said third loop onto said fourth plane.

4. The probe according to any of the preceding items, comprising more than four cantilevers.

5. The probe according to any of the preceding items, said probe being made of single crystal Si, poly-Si or SiO2.

6. The probe according to any of the preceding items, said probe comprising an insulating layer between said first cantilever and said probe body.

7. The probe according to any of the preceding items, comprising a first contact pad on said first side, said first contact probe being connected to said first contact pad via a first electrical line.

8. The probe according to item 7, comprising a second contact pad on said first side, said second contact probe being connected to said second contact pad via a second electrical line.

9. The probe according to any of the preceding items, wherein a first axis is defined as the axis extending through said proximal end and said distal end.

10. The probe according to item 9, said first cantilever comprising a first section at said distal end, wherein said first section extends substantially orthogonal to said first axis and constitutes a first lateral section.

11. The probe according to item 10, said first lateral section defining a substantially straight line.

12. The probe according to item 10, said first lateral section defining a curved line.

13. The probe according to any of the preceding items, said first contact probe being made of a metal film deposited on a first cantilever surface of said first cantilever.

14. The probe according to item 10, said first lateral section comprising a first protrusion extending substantially orthogonal to said first plane.

15. The probe according to items 9 and 14, said first protrusion having a first cross section with a normal in a direction orthogonal to said first axis, said first cross section defining a trapezoid or rectangular geometry.

16. The probe according to item 14, said first lateral section comprising a second protrusion separated from said first protrusion.

17. The probe according to any of the preceding items, said first cantilever being connected with said second cantilever at said distal end for defining a mono-cantilever.

18. The probe according to item 17, wherein a plurality of cantilevers are connected at said distal end to form a mono-cantilever.

19. The probe according to any of the preceding items, said probe comprising an insulating layer between said first cantilever and said first contact probe.

20. The probe according to any of the preceding items, said first cantilever being interconnected with said second cantilever for forming a strain gauge.

21. A probe for testing an electrical property of a test sample, said probe comprising:
a probe body having a first side defining a substantially planar body surface,
said first probe body being manufactured from a semiconductor wafer,
a first arm extending from said probe body, and having a proximal end at said probe body and a distal end, said distal end being opposite to said proximal end,
said first arm defining a first loop with respect to said probe body, said first loop extending in a first plane substantially parallel to said planar body surface,
said first arm comprising a metal film deposited on and extending on a first surface of said first arm,
a first cantilever extending from said probe body towards said distal end,
said first cantilever extending in a second plane substantially parallel to said first plane,
said first cantilever being within a projection of said first loop onto said second plane,
a first contact pad on said first side,
a second contact pad on said first side,
said first contact pad being connected to said second contact pad via a first electrical line on said probe body and said metal film on said first arm and a second electrical line on said probe body thereby forming a path for an electrical current for forming a magnetic field substantially orthogonal to said second plane at said second plane.

22. The probe according to item 21, comprising a plurality of cantilevers.

23. The probe according to item 21, said magnetic field being substantially orthogonal to a plane of the test sample during a test.

24. A method of testing an electrical property of a test sample, said method comprising:
providing a multi point probe,
said probe comprising:
a probe body having a first side defining a substantially planar body surface,
a first cantilever extending from said probe body, and having a proximal end at said probe body and a distal end, said distal end being opposite to said proximal end, said first cantilever defining a first loop with respect to said probe body, said first loop extending in a first plane substantially parallel to said planar body surface,
a first contact probe being supported by said first cantilever,
providing a second contact probe being electrically insulated from said first contact probe, said second contact probe being supported by said first cantilever or a second cantilever extending from said probe body towards said distal end,
said second cantilever defining a second loop with respect to said probe body, said second loop extending in a second plane substantially parallel to said first plane,
and said second loop being within a projection of said first loop onto said second plane,
said method further comprising:
contacting said first contact probe with said test sample at a first contact point,
contacting said second contact probe with said test sample at a second contact point, and
performing a multi point measuring routine.

25. The method according to item 24, said multi point measuring routine comprises measuring a voltage between said first contact probe and said second contact probe.

26. The method according to item 24 or 25, said multi point probe being a four point probe.

27. The method according to item 24 or 25, said multi point probe comprising a third contact probe and a fourth contact probe.

28. The method according to item 27, comprising injecting a current in said test sample via said third contact probe and said fourth contact probe.

29. The method according to items 25 and 28, comprising determining an electrical resistance value of said test sample as a function of said voltage and said current.

30. A method of initializing a routine for testing an electrical property of a semiconductor wafer having a native oxide surface layer, said method comprising
providing a multi point probe,
said probe comprising:
a probe body,
a first cantilever extending from said probe body,
a first contact probe being supported by said first cantilever,
a second contact probe being electrically insulated from said first contact probe,
said second contact probe being supported by said first cantilever or a second cantilever extending from said probe body,
said method further comprising:
contacting said first contact probe with said semiconductor wafer at a first contact point,
contacting said second contact probe with said silicon wafer at a second contact point, and applying a first voltage between said first contact point and said second contact point so as to cause an electric breakdown of said native oxide surface layer of said semiconductor wafer.

31. A method of initializing a routine for testing an electrical property of a semiconductor wafer,
said method comprising
providing a multi point probe,
said probe comprising:
a probe body,
a first cantilever extending from said probe body,
a first contact probe being supported by said first cantilever,
a second contact probe being electrically insulated from said first contact probe,
said second contact probe being supported by said first cantilever or a second cantilever extending from said probe body,
said first contact probe and/or said second contact probe comprising an oxide surface layer,
said method further comprising:
contacting said first contact probe with said semiconductor wafer at a first contact point,
contacting said second contact probe with said silicon wafer at a second contact point, and
establishing a first voltage between said first contact point and said second contact point so as to cause an electric breakdown of said native oxide surface layer of said first contact probe and/or said second contact probe.

32. The method according to item 31, said first contact probe being made of a first non noble metal and/or said second contact probe being made of a second non noble metal.

33. The method according to item 31, said first contact probe being made of a first base metal and/or said second contact probe being made of a second base metal.

34. The method according to item 30 or 31, said first voltage being established by applying an alternating current between said first contact point and said second contact point having an amplitude value between 10 µA and 200 µA.

35. The method according to item 34, said first voltage being greater than 0 V and less than 10 V.

36. The method according to item 31, said probe comprising a third contact probe and a fourth contact probe, said method further comprising contacting said third contact probe with said semiconductor wafer at a third contact point, and contacting said fourth contact probe with said silicon wafer at a fourth contact point.

37. The method according to item 36, comprising establishing a second voltage between said first contact point and said third contact point.

38. The method according to item 37, comprising establishing a third voltage between said first contact point and said fourth contact point.

39. The method according to item 38, comprising establishing a fourth voltage between said second contact point and said fourth contact point.

In the following is given a list of reference signs that are used in the detailed description of the invention and the drawings referred to in the detailed description of the invention.
10 Probe
12 Probe body
14 Test sample
16 First side
18 Second side
20a First cantilever
20b Second cantilever
20c Third cantilever
20d Fourth cantilever
22 Metal film
24 Electrical line
26 Contact pad
28a Top electric Insulator
28b Buried electric insulator
30a First lateral section
30b Second lateral section
30c Third lateral section
30d Fourth lateral section
32a Second section
32b Third section
32c Fourth section
32d Fifth section
32e Sixth section
32f Seventh section
36 Cantilever surface
38 Fin
40 Front side
42 Face
44a First protrusion
44b Second protrusion
44c Third protrusion
44d Fourth protrusion
44e Fifth protrusion
44f Sixth protrusion
44g Seventh protrusion
44h Eighth protrusion
44i Ninth protrusion
44j Tenth protrusion
44k Eleventh protrusion
44l Twelfth protrusion
52a First contact probe
52b Second contact probe
52c Third contact probe
52d Fourth contact probe
52e Fifth contact probe
52f Sixth contact probe
54 Mono-cantilever body
56 Strain gauge
60 First arm
62a First magnet element
62b Second magnet element

The invention claimed is:

1. A probe for testing an electrical property of a test sample, the probe comprising:
a probe body having a first side defining a substantially planar body surface;
a first cantilever extending from a proximal end at the probe body to a distal end, the first cantilever defining a first loop with respect to the probe body, the first loop extending in a first plane substantially parallel to the planar body surface;
a first contact probe supported by the first cantilever;
a second cantilever extending from a proximal end at the probe body towards a distal end, the second cantilever defining a second loop with respect to the probe body, the second loop extending in a second plane substantially parallel to the first plane, the second loop being within a projection of the first loop onto the second plane; and
a second contact probe electrically insulated from the first contact probe, the second contact probe being supported by one of the first cantilever and the second cantilever.

2. The probe according to claim 1, further comprising a third cantilever extending from a proximal end at the probe body towards a distal end, the third cantilever defining a third loop with respect to the probe body, the third loop extending in a third plane substantially parallel to the second plane, wherein the third loop is within a projection of the second loop onto the third plane.

3. The probe according to claim 2, further comprising a fourth cantilever extending from a proximal end at the probe body towards a distal end, the fourth cantilever defining a fourth loop with respect to the probe body, the fourth loop extending in a fourth plane substantially parallel to the third plane, wherein the fourth loop is within a projection of the third loop onto the fourth plane.

4. The probe according to claim 1, wherein the probe is made of a material selected from the group consisting of single crystal Si, poly-Si, and $SiO_2$.

5. The probe according to claim 1, further comprising an insulating layer between the first cantilever and the probe body.

6. The probe according to claim 1, further comprising a first contact pad on the first side of the probe body, wherein the first contact probe is connected to the first contact pad via a first electrical line.

7. The probe according to claim 6, further comprising a second contact pad on the first side of the probe body, wherein the second contact probe is connected to the second contact pad via a second electrical line.

8. The probe according to claim 1, wherein a first axis is defined as extending through the proximal end and the distal end of each of the first and second cantilevers.

9. The probe according to claim 8, wherein each of the first cantilever and the second cantilever comprises a lateral section at the distal end, the lateral section extending substantially orthogonal to the first axis.

10. The probe according to claim 8, wherein each of the first cantilever and the second cantilever includes a protrusion at the distal end, the protrusion having a cross section with a normal in a direction orthogonal to the first axis, the cross section defining one of a trapezoidal and rectangular geometry.

11. A probe for testing an electrical property of a test sample, the probe comprising:
    a probe body formed from a semiconductor wafer and having a first side defining a substantially planar body surface;
    a first arm extending from a proximal end at the probe body to a distal end, the first arm defining a first loop with respect to the probe body, the first loop extending in a first plane substantially parallel to the planar body surface, the first arm comprising a metal film on a first surface of the first arm;
    a first cantilever extending from the probe body towards the distal end, the first cantilever extending in a second plane substantially parallel to the first plane, the first cantilever being within a projection of the first loop onto the second plane;
    a first contact pad and a second contact pad on the first side of the probe body, the first contact pad being connected to the second contact pad via a first electrical line on the probe body and the metal film on the first arm and a second electrical line on the probe body, thereby forming a path for an electrical current to form a magnetic field substantially orthogonal to the second plane at the second plane.

12. A method of testing an electrical property of a test sample, the method comprising:

(a) providing a multi-point probe, comprising:
    a probe body having a first side defining a substantially planar body surface;
    a first cantilever extending from a proximate end at the probe body to a distal end, the first cantilever defining a first loop with respect to the probe body, the first loop extending in a first plane substantially parallel to the planar body surface;
    a first contact probe supported by the first cantilever;
    a second cantilever extending from said probe body towards the distal end, the second cantilever defining a second loop with respect to the probe body, the second loop extending in a second plane substantially parallel to said first plane, the second loop being within a projection of the first loop onto the second plane; and
    a second cantilever extending from a proximal end at the probe body towards a distal end, the second cantilever defining a second loop with respect to the probe body, the second loop extending in a second plane substantially parallel to the first plane, the second loop being within a projection of the first loop onto the second plane;

(b) providing a second contact probe electrically insulated from the first contact probe, the second contact probe supported by one of the first cantilever and the second cantilever;

(c) contacting the first contact probe with the test sample at a first contact point;

(d) contacting the second contact probe with the test sample at a second contact point; and (e) performing a multi-point measuring routine using the contact of the first contact probe with the first contact point and the contact of the second contact probe with the second contact point.

13. A method of initializing a routine for testing an electrical property of a semiconductor wafer having a native oxide surface layer, the method comprising:

(a) providing a multi-point probe, comprising:
    a probe body;
    a first cantilever extending from the probe body;
    a first contact probe supported by the first cantilever;
    a second cantilever extending from the probe body; and
    a second contact probe electrically insulated from the first contact probe supported by one of the first cantilever and the second cantilever;

(b) contacting the first contact probe with the semiconductor wafer at a first contact point;

(c) contacting the second contact probe with the semiconductor wafer at a second contact point; and (d) applying a first voltage between the first contact point and the second contact point so as to cause an electric breakdown of the native oxide surface layer of the semiconductor wafer.

14. A method of initializing a routine for testing an electrical property of a semiconductor wafer, the method comprising:

(a) providing a multi-point probe, comprising:
    a probe body;
    a first cantilever extending from the probe body;
    a first contact probe supported by the first cantilever;
    a second cantilever extending from the probe body; and
    a second contact probe electrically insulated from the first contact probe and supported by one of the first cantilever and the second cantilever;

wherein at least one of the first contact probe and the second contact probe comprises a native oxide surface layer;

(b) contacting the first contact probe with the semiconductor wafer at a first contact point;

(c) contacting the second contact probe with the semiconductor wafer at a second contact point; and (d) establishing a first voltage between the first contact point and the second contact point so as to cause an electric breakdown of the native oxide surface layer of the at least one of the first contact probe and the second contact probe that has a native oxide surface layer.

\* \* \* \* \*